United States Patent [19]
Tomita

[11] Patent Number: 5,907,505
[45] Date of Patent: May 25, 1999

[54] POWER SOURCE CIRCUIT DEVICE USED FOR A SEMICONDUCTOR MEMORY

[75] Inventor: Naoto Tomita, Yokohama, Japan

[73] Assignee: Kabushiki Kaisha Toshiba, Tokyo, Japan

[21] Appl. No.: 08/940,135

[22] Filed: Sep. 29, 1997

[30] Foreign Application Priority Data

Sep. 30, 1996 [JP] Japan .................................. 8-279023

[51] Int. Cl.⁶ .................................................. G11C 7/00
[52] U.S. Cl. .............................. 365/185.18; 365/185.2; 365/185.23
[58] Field of Search ........................ 365/185.18, 185.2, 365/185.23, 185.24

[56] References Cited

U.S. PATENT DOCUMENTS 5,077,691  12/1991  Haddad et al. .
5,642,309   6/1997  Kim et al. .......................... 365/185.22

*Primary Examiner*—Vu A. Le
*Attorney, Agent, or Firm*—Loeb & Loeb LLP

[57] ABSTRACT

In a power source circuit device used for a non-volatile semiconductor memory, by erasing data with a gate voltage of a memory cell set to V, an external high voltage power source connected to the memory cell is replaced with a charge pump, and a charge pump circuit, a boost circuit consisting of a power source switch circuit, and a boost circuit consisting of a charge pump are provided in a semiconductor device.

18 Claims, 9 Drawing Sheets

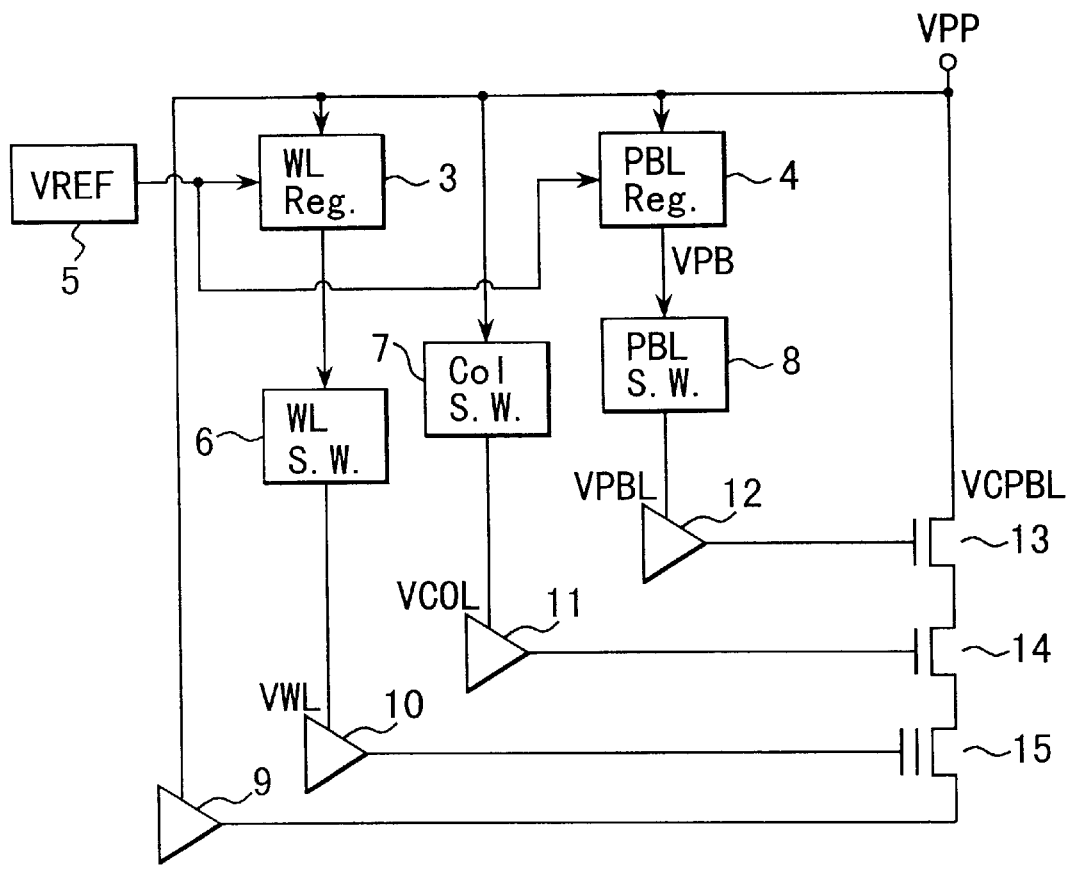
FIG. 1 (PRIOR ART)
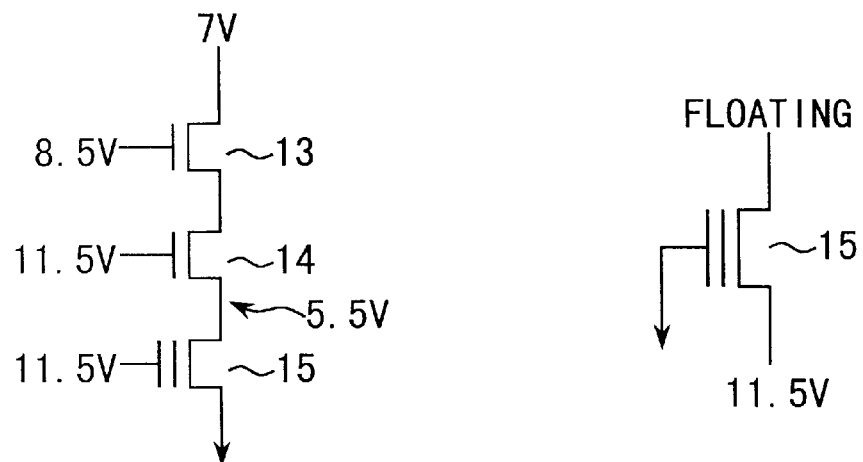
FIG. 2
FIG. 3

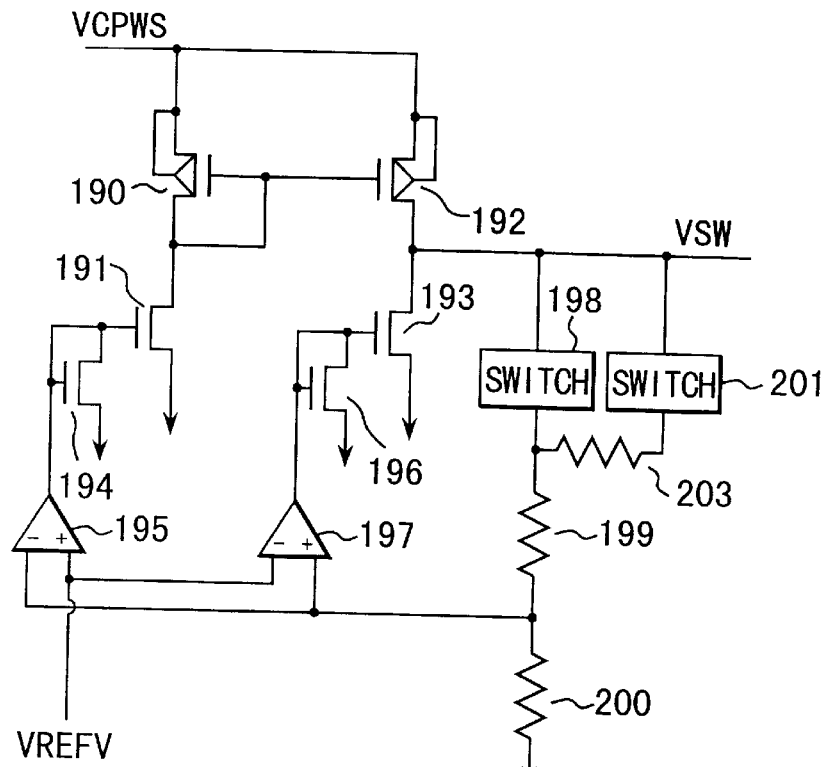
F I G. 1 2
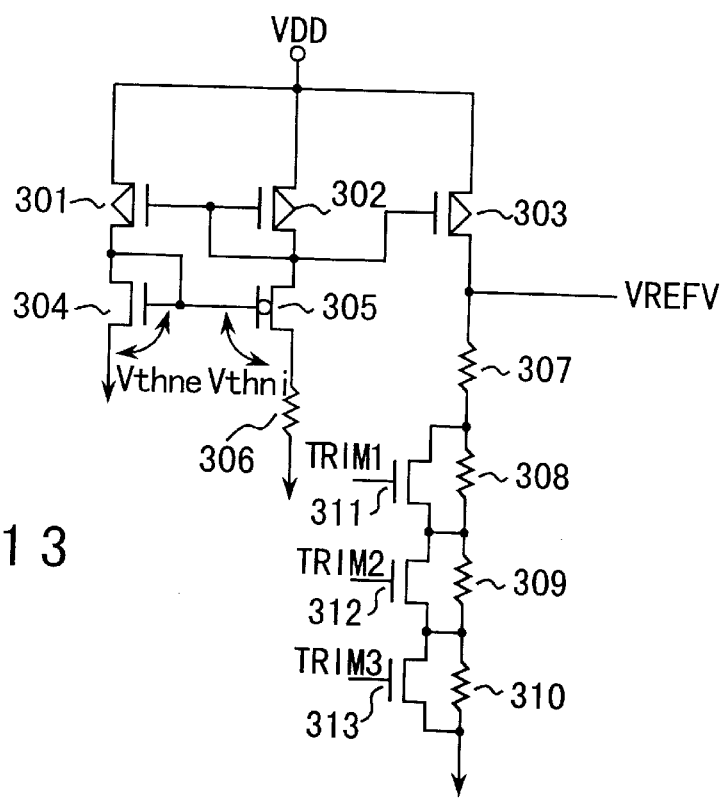
F I G. 1 3

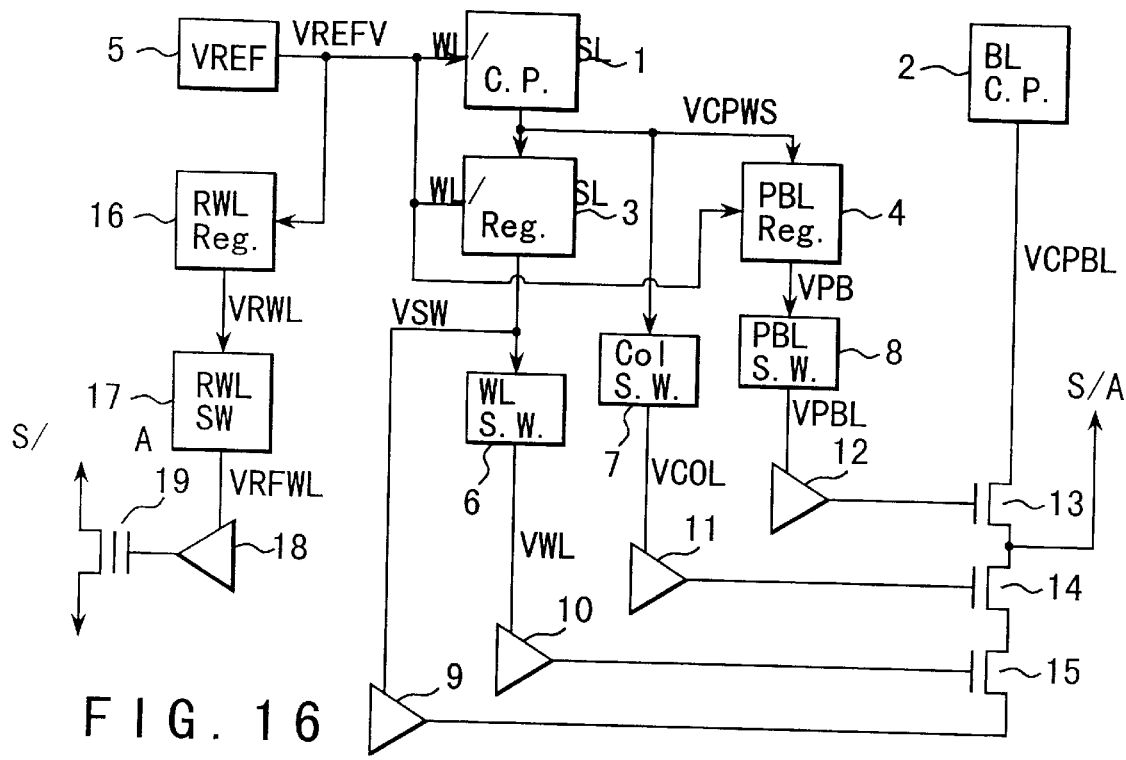
F I G. 16
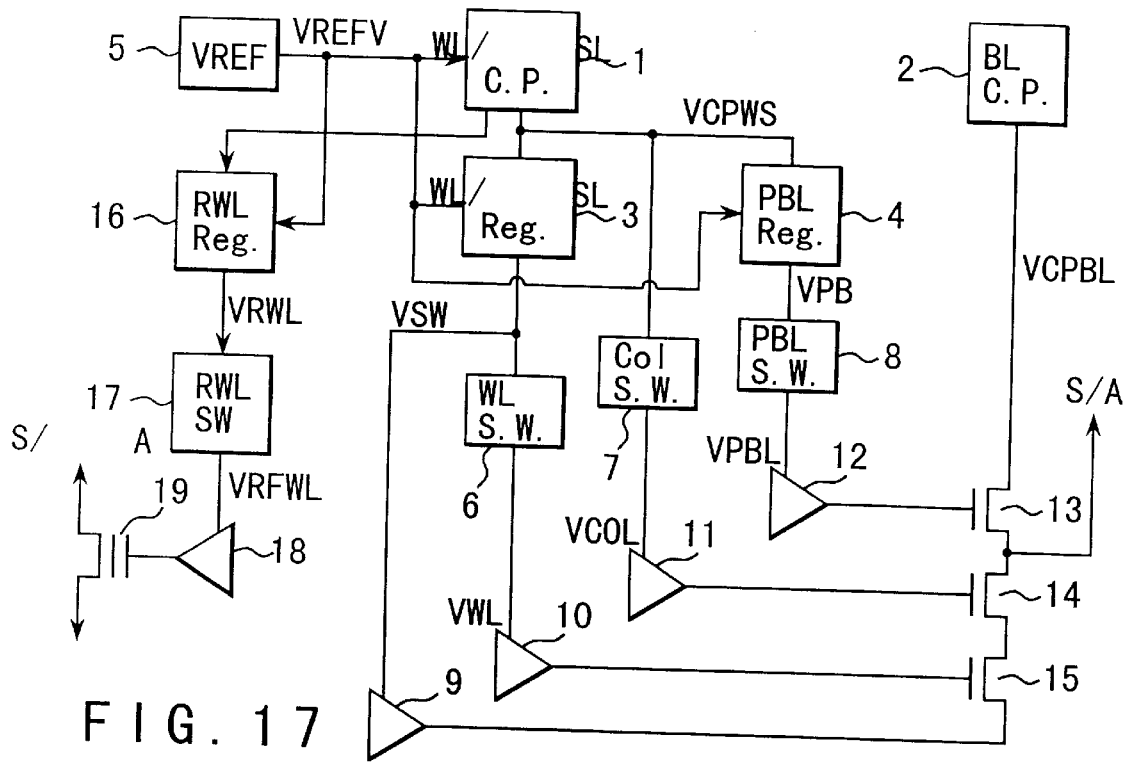
F I G. 17

POWER SOURCE CIRCUIT DEVICE USED FOR A SEMICONDUCTOR MEMORY

BACKGROUND OF THE INVENTION

The present invention relates to a power source circuit device used for a semiconductor memory such as a flash memory, an EEPROM, or the like.

FIG. 1 shows a structure of a conventional power source circuit used for a flash memory, in which an external power source VPP of, for example, 12V used for writing and erasing data on a memory cell is provided in addition to a VDD power source (not shown) used for normal reading operation.

A reference potential generation circuit VREF 5 generates a reference potential and supplies the potential to input terminals of a stepdown circuit WL Reg. 3 and a stepdown circuit PBL Reg. 4.

The input terminal of the stepdown circuit 3 is supplied with output potentials of the high voltage power source potential VPP and the reference potential generation circuit VREF 5. An output of the stepdown circuit 3 is supplied to an input terminal of a power source switch circuit WL SW 6.

The stepdown circuit 3 directly outputs a high voltage power source potential VPP without lowering this power source potential VPP when writing or erasing data on a memory cell 15. When verification is performed, the high voltage power source potential VPP is stepped down to, for example, 6V which is outputted.

The input terminal of the power source switch circuit 6 is supplied with the output potential of the stepdown circuit 3 and the power source potential VDD, and the output terminal of the circuit 6 is connected to the power source terminal VWL of the row decoder circuit 10.

The power source switch circuit 6 selects and outputs either one of the output potential or the power source potential VDD in accordance with the state of the memory cell 15, i.e., the state in which data is written, the state in which data is erased, or the state in which data is verified.

The row decoder circuit 10 supplies a potential supplied from the power source switch circuit 6, to a selected word line.

In addition, the power source terminal of a cell source decoder circuit 9 is supplied with a high voltage potential VPP. The cell source decoder circuit 9 supplies a high voltage source potential VPP to a source of the memory cell 15 when erasing data on the memory cell 15.

Further, an input terminal of a power source switch circuit Col. SW 7 is supplied with a high voltage power source potential VPP and a power source potential VDD (not shown), while an output terminal of the power source switch circuit Col. SW 7 is connected with a power source terminal VCOL of a column decoder circuit 11. The power source switch circuit Col. SW 7 selects and outputs either a high-voltage power source potential VPP or a power source potential VDD in accordance with the state of the memory cell 15, i.e., the state in which data is written into the memory cell 15, the state in which data is erased therefrom, or the state in which data is read therefrom or the state in which data is verified.

In addition, an output terminal of the column decoder circuit 11 is connected to a gate of a column select transistor 14 and outputs a potential to be supplied to the power source terminal VCOL of the column decoder circuit 11.

In addition, an input terminal of a stepdown circuit PBL Reg. 4 is supplied with a high-voltage power source potential VPP and an output potential of a reference potential generation circuit 5. The stepdown circuit 4 steps down a high voltage power source potential VPP to generate a potential of, for example, 8.5V to be applied to a gate of a write transistor 13 when writing data into a cell, and the stepdown circuit 4 supplies the potential to an input terminal of the power source switch circuit PBL SW 8.

The input terminal of the power source switch circuit 8 is supplied with an output potential VPB of the stepdown circuit 4 and the power source potential VDD. An output terminal of the power source switch circuit 8 is connected to a power source terminal VPBL of a write transistor decoder circuit 12. The power source switch circuit 8 selects and outputs either an output potential of the stepdown circuit 4 or an external power source potential VDD, in accordance with the state of the memory cell, i.e., the state in which data is written into the memory cell, the state in which data is erased therefrom, or the state in which data is read therefrom.

The write transistor decoder circuit 12 outputs a potential supplied from the power source switch circuit 8, to a gate of the write transistor 13.

In addition, a drain of the write transistor 13 is supplied with a high voltage power source potential VPP.

In a power source circuit used in a non-volatile semiconductor memory such as a conventional flash memory as described above, it is necessary to prepare an external high voltage power source VPP for a high potential to be used for writing and erasing, in addition to a power source VDD used for normal reading operation. Therefore, there is a problem that costs must be raised, and therefore, developments in a power source circuit device which is capable of reading or verifying data on a memory cell without using an external high voltage power source VPP have been waited for.

U.S. Pat. No. 5,077,691 discloses a structure from which an external high-voltage power source is omitted and in which an external high-voltage power source connected to a memory cell is replaced with a charge pump. However, this structure is limited to a case where data is erased with a negative gate voltage, and therefore, the memory cell itself must be improved in order to maintain a constant erasing characteristic and a retaining characteristic of data processing of the memory cell.

BRIEF SUMMARY OF THE INVENTION

In view of the current situation as described above, the present invention has an object of providing a power source circuit device used for a semiconductor memory in which a conventional memory cell is used without changing bias conditions when writing data and an external high voltage power source to be connected to the memory cell is replaced with a charge pump, by erasing data with the gate voltage of the memory cell set to 0V, so that an external high voltage power source is omitted and increases in costs are restricted.

To achieve the above object, a power source circuit device used for a semiconductor memory, according to the present invention, comprises: a reference potential generation circuit for outputting a reference potential; a first boost circuit having an input terminal supplied with the reference potential, for outputting either a power source potential VDD or a first high voltage potential generated; a second boost circuit for generating and outputting a second high voltage potential used for a drain potential of a write transistor; a first stepdown circuit having an input terminal supplied with the output potential of the first boost circuit and the reference potential, for outputting either a potential obtained by lowering the output potential of the first boost circuit or the output potential of the first boost circuit, to be used for a gate potential and a source potential of a memory cell; a second stepdown circuit having an input terminal supplied with the output potential of the first boost circuit and the reference potential, for outputting a potential obtained by lowering the output potential of the first boost circuit, to be used for a gate potential of the write transistor; at least one first power switch circuit having an input terminal supplied with the first stepdown circuit, for outputting either the output potential of the first stepdown circuit or the power source potential, to be used for the gate potential of the memory cell; a second power switch circuit having an input terminal supplied with the output potential of the first boost circuit, for outputting either the output potential of the first boost circuit or the power source potential, to be used for a gate potential of a column select transistor; a third power source switch circuit having an input terminal supplied with the output potential of the second stepdown circuit, for outputting either the output potential of the second stepdown circuit or the power source potential, to be used for the gate potential of the write transistor; a cell source decoder having a power source terminal supplied with the output potential of the first stepdown circuit; a row decoder circuit having at least one power source terminal respectively supplied with the output potential of the at least one power switch circuit; a column decoder having a power source terminal supplied with the output potential of the second power source switch circuit; and a write transistor decoder circuit having a power source terminal supplied with the output potential of the third power source switch circuit.

In addition, a power source circuit device used for a semiconductor memory, according to the present invention, comprises: a reference potential generation circuit for outputting a reference potential; a first boost circuit having an input terminal supplied with the reference potential, for outputting either a power source potential VDD or a first high voltage potential generated, and for supplying the first high voltage potential as a drain potential for a write transistor; a first stepdown circuit having an input terminal supplied with the output potential of the first boost circuit and the reference potential, for outputting either a potential obtained by lowering the output potential of the first boost circuit or the output potential of the first boost circuit, to be used for a gate potential and a source potential of a memory cell; a second stepdown circuit having an input terminal supplied with the output potential of the first boost circuit and the reference potential, for outputting a potential obtained by lowering the output potential of the first boost circuit, to be used for a gate potential of the write transistor; at least one first power switch circuit having an input terminal supplied with the first stepdown circuit, for outputting either the output potential of the first stepdown circuit or the power source potential, to be used for the gate potential of the memory cell; a second power switch circuit having an input terminal supplied with the output potential of the first boost circuit, for outputting either the output potential of the first boost circuit or the power source potential, to be used for a gate potential of a column select transistor; a third power source switch circuit having an input terminal supplied with the output potential of the second stepdown circuit, for outputting either the output potential of the second stepdown circuit or the power source potential, to be used for the gate potential of the write transistor; a cell source decoder having a power source terminal supplied with the output potential of the first stepdown circuit; a row decoder circuit having at least one power source terminal respectively supplied with the output potential of the at least one power switch circuit; a column decoder having a power source terminal supplied with the output potential of the second power source switch circuit; and a write transistor decoder circuit having a power source terminal supplied with the output potential of the third power source switch circuit.

In addition, a power source circuit device used for a non-volatile semiconductor memory, according to the present invention, comprises: a reference potential generation circuit for outputting a reference potential; a first boost circuit having an input terminal supplied with the reference potential, for outputting either a power source potential VDD or a first high voltage potential generated; a second boost circuit for generating and outputting a second high voltage potential used for a drain potential of a write transistor; a first stepdown circuit having an input terminal supplied with the output potential of the first boost circuit and the reference potential, for outputting either a potential obtained by lowering the output potential of the first boost circuit or the output potential of the first boost circuit, to be used for a gate potential and a source potential of a memory cell; a second stepdown circuit having an input terminal supplied with the output potential of the first boost circuit and the reference potential, for outputting a potential obtained by lowering the output potential of the first boost circuit, to be used for a gate potential of the write transistor; and a third stepdown circuit having an input terminal supplied with the reference potential, for outputting a potential obtained by lowering the power source potential VDD, to be used for a gate potential of a reference memory cell.

In addition, a power source circuit device used for a non-volatile semiconductor memory, according to the present invention, comprises: a first reference potential generation circuit for outputting a first reference potential and for stopping operation in a stand-by state; a second reference potential generation circuit of a low power consumption type, for outputting a second reference potential; a first boost circuit having an input terminal supplied with the first reference potential, for outputting either a power source potential or a first high voltage potential generated; a second boost circuit for generating and outputting a second high voltage potential used for a drain potential of a write transistor; a first stepdown circuit having an input terminal supplied with the output potential of the first boost circuit and the first and second reference potentials, for outputting either a potential obtained by lowering the output potential of the first boost circuit or the output potential of the first boost circuit, to be used for a gate potential and a source potential of a memory cell; and a second stepdown circuit having an input terminal supplied with the output potential of the first boost circuit and the first reference potential, for outputting a potential obtained by lowering the output potential of the first boost circuit, to be used for a gate potential of the write transistor.

Further, a power source circuit device used for a non-volatile semiconductor memory, according to the present invention, comprises: a first reference potential generation circuit for outputting a first reference potential and for stopping operation in a stand-by state; a second reference potential generation circuit of a low power consumption type, for outputting a second reference potential; a first boost circuit having an input terminal supplied with the first reference potential, for outputting either a power source potential or a first high voltage potential generated; a second boost circuit for generating and outputting a second high voltage potential used for a drain potential of a write transistor; a first stepdown circuit having an input terminal supplied with the output potential of the first boost circuit and the first reference potential of the first reference potential generation circuit, for outputting either a potential obtained by lowering the output potential of the first boost circuit or the output potential of the first boost circuit, to be used for a gate potential and a source potential of a memory cell; a second stepdown circuit having an input terminal supplied with the output potential of the first boost circuit and the first reference potential, for outputting a potential obtained by lowering the output potential of the first boost circuit, to be used for a gate potential of the write transistor; a second reference potential generation circuit of a low power consumption type, for outputting a second reference potential; and a third stepdown circuit having an input terminal supplied with the second reference potential of the second reference potential generation circuit, for outputting a potential obtained by lowering the power source potential, to be used for the gate potential of the memory cell when reading data from the memory cell.

By adopting the structure as described above, according to the present invention, it is possible to provide a power source circuit device used for a non-volatile semiconductor memory in which a conventional memory cell is used without changing bias conditions when writing data and an external high voltage power source to be connected to the memory cell is replaced with a charge pump, by erasing data with the gate voltage of the memory cell set to 0V, so that an external high voltage power source is omitted and increases in costs are restricted.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 1 is a view showing a structure of a power source circuit used for a non-volatile semiconductor memory which uses an external power source VPP for a high potential in addition to a conventional VDD power source;

FIG. 2 is a view explaining a voltage applied to a memory cell of a flash memory;

FIG. 3 is a view explaining a voltage applied when erasing data in the memory cell shown in FIG. 2;

FIG. 12 is a view of a specific circuit configuration of another embodiment of a stepdown circuit shown in FIG. 4;

FIG. 13 is a view of a specific circuit configuration of a first embodiment of a reference potential generation circuit shown in FIG. 4;

FIG. 16 is a view of a circuit configuration showing a third embodiment of a power source circuit used for a non-volatile semiconductor memory according to the present invention;

FIG. 17 is a view showing a partial modification of the power source circuit shown in FIG. 15;

DETAILED DESCRIPTION OF THE INVENTION

In the following, embodiments of the present invention will be explained with reference to the drawings.

At first, with reference to FIGS. 2 and 3, explanation will be made to a voltage to be applied when various operations are performed by a flash memory.

FIG. 2 shows an example of a voltage applied when writing data into a memory cell 15.

A write transistor 13 serves to control a drain voltage of the cell 15. A drain of the write transistor 13 is applied with a voltage of, for example, 7V, and a gate of the transistor 13 is applied with a voltage of 8.5V.

A gate of a column select transistor 14 is applied with a voltage of 11.5V, and the column select transistor 14 is rendered conductive. As a result of this, a voltage of 5.5V is applied to a drain of the memory cell 15. The gate of the memory cell 15 is applied with a voltage of, for example, 11.5V, and a source of the memory cell 15 is applied with a voltage of, for example, 0V, so that electric charges are injected to the floating gate from the source.

FIG. 3 shows a voltage applied when erasing data in the memory cell 15.

In this case, the source of the memory cell 15 is supplied with a voltage of, for example, 11.5V, and the gate thereof is applied with a voltage of 0V, so that charges are emitted from the floating gate to the source. The drain of the memory cell 15 is brought into a floating state.

As for voltages applied when reading out data from the memory cell 15, for example, a voltage of 5V is applied to each of the gate of the transistor 13, the gate of the column select transistor 14, and the gate of the memory cell 15.

As for voltages applied when verifying data in the memory cell 15, a voltage of 5V is applied to each of the gate of the transistor 13 and the gate of the column select transistor 14 while a voltage of 6.5V is applied to the gate of the memory cell 15. Further, when erasing and verifying data in the memory cell, a voltage of 5V is applied to each of the gate of the transistor 13 and the gate of the column select transistor 14 while a voltage of 4V is applied to the gate of the memory cell 15.

Figure 4:
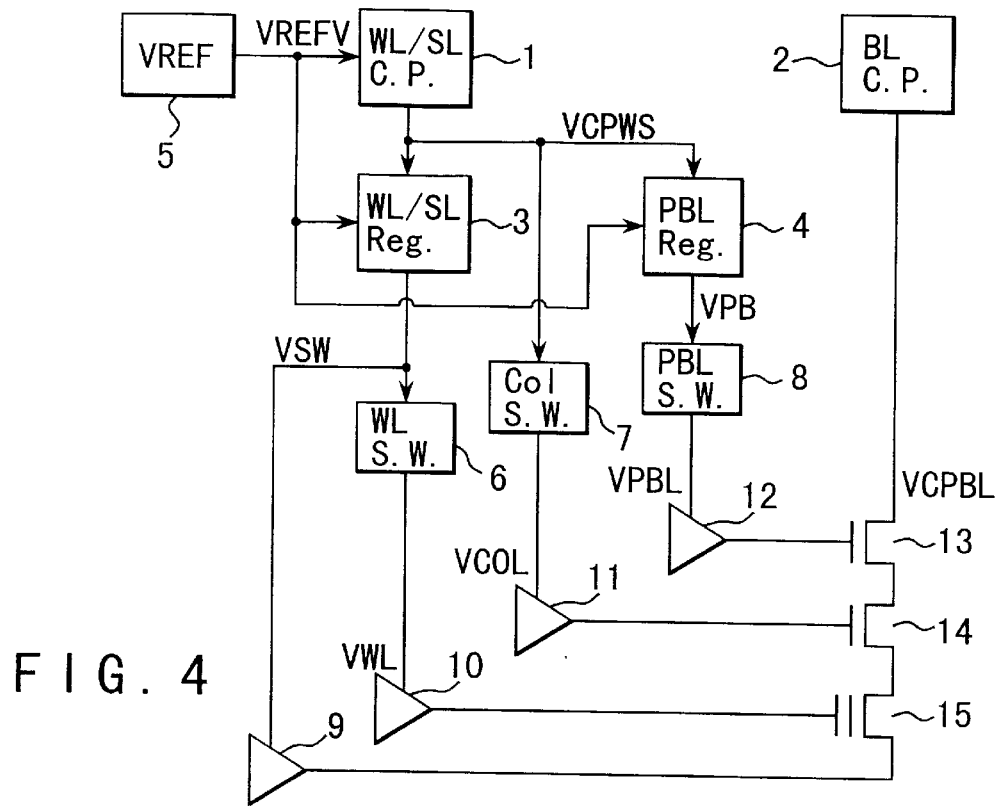
FIG. 4 is a view of a structure of a power source circuit showing a first embodiment used for a non-volatile semiconductor memory having a structure in which an external high-voltage power source connected to a memory cell is replaced with a charge pump.

FIG. 4 is a block diagram of a power source circuit of the present invention.

In a boost circuit WL/SL C. P. 1, the output potential VCPWS is supplied to an input terminal of a stepdown circuit WL/SL Reg. 3, an input terminal of a power source select circuit Col. SW7, and an input terminal of a stepdown circuit PBL Reg. 4.

In addition, the boost circuit WL/SL C. P. 1 is supplied with a reference potential VREFV generated by a reference potential generation circuit VREF5, and this reference potential is used as a reference for potential comparison when controlling operation of the boost circuit 1.

The boost circuit 1 outputs a high potential of, for example, 11.5V when writing, erasing, and verifying data on the memory cell. Meanwhile, when reading data from the memory cell, the boost circuit 1 outputs a power source potential VDD.

The high potential output is directly used or is reduced and used for a gate potential of the cell 15 when writing data on the memory cell, a gate potential of a column select transistor 14, a gate potential of a write transistor 13, a source potential of the cell 15 when erasing data on the memory cell 15, and a gate potential of the cell 15 when verifying data after writing or erasing operation.

A boost circuit BL C. P. 2 generates a high potential of, for example, 7V and supplies this potential to a drain of the transistor 13. This potential is used to supply a cell bit current when writing data on the memory cell 15.

An input terminal of a stepdown circuit WL/SL Reg. 3 is supplied with an output potential VCPWS of the boost circuit 1 and an output potential VREFV of a reference potential generation circuit 5. An output terminal of the stepdown circuit WL/SL Reg. 3 is connected to an input terminal of a power source switch circuit WL SW6 and a power source terminal of a cell source decoder circuit 9.

The stepdown circuit 3 does not lowers but directly outputs an output potential VCPWS of the boost circuit 1 when writing and erasing data on the memory cell. The stepdown circuit 3 lowers the potential VCPWS to, for example, 6V and outputs the lowered potential when verifying data after writing and erasing data on the memory cell.

An input terminal of the stepdown circuit PBL Reg. 4 is supplied with an output potential VCPWS of a boost circuit 1 and an output potential VREFV of a reference potential generation circuit 5, and an output terminal of the stepdown circuit PBL Reg. 4 is connected to an input terminal of a power switch circuit PBL SW 8. In order to control a cell drain voltage, the stepdown circuit 4 lowers the potential of, for example, 8.5V applied to the gate of a write transistor 13, thereby to generate the cell drain voltage, when writing data on the memory cell.

Note that the stepdown circuits 3 and 4 use a reference potential VREFV generated by the reference potential generation circuit 5, to reduce and stabilize changes in respective output potentials VSW and VPB.

The reference potential generation circuit VREF 5 generates a potential VREFV which is used as a reference when the boost circuit 1 and the stepdown circuits 3 and 4 generate output potentials VCPWS, VSW, and VPB.

An input terminal of a power source switch circuit WL SW 6 is supplied with an output potential VSW of a stepdown circuit 3 and an external power source potential VDD, and an output terminal of the power source switch circuit 6 selects and outputs either a potential VSW or a power source potential VDD in accordance with the state, i.e., the state in which data is written on the cell, the state in which data is read from the cell, the state in which data is erased from the cell, or the state in which data is verified. A plurality of power source switch circuits 6 may be provided in order to reduce the load capacity of a cell array.

In this case, a row decoder 10 is provided with power source terminals corresponding in number to power source switch circuits 6, and the power source terminals are connected respectively to output terminals of the power source switch circuits 6. Thus, the number of cell arrays to which an output potential is supplied from one power source switch circuit can be reduced.

An input terminal of the power source switch circuit Col. SW 7 is supplied with an output potential VCPWS of a boost circuit 1 and an external power source potential VDD, and an output terminal of the power source switch circuit Col. SW 7 is connected to a power source terminal VCOL of a column decoder circuit 11. The power source switch circuit 7 selects and outputs either a potential VCPWS or a power source potential VDD in correspondence with the state in which data is written into a cell, the state in which data is read from the cell, the state in which data is erased from the cell, or the state in which data is verified.

An input terminal of the power source switch circuit PBL SW 8 is supplied with an output potential VPB of the stepdown circuit 4 and an external power source potential VDD, and an output terminal of the power source switch circuit is connected to a power source terminal VPBL of a write transistor decoder 12. The power source switch circuit 8 selects and outputs a potential VPB or a power source potential VDD in correspondence with a state, e.g., a cell writing state, a cell reading state, a cell erasing state, or a cell verifying state.

In the next, a specific circuit of each block in the power source circuit shown in FIG. 4 will be explained.

Figure 5:
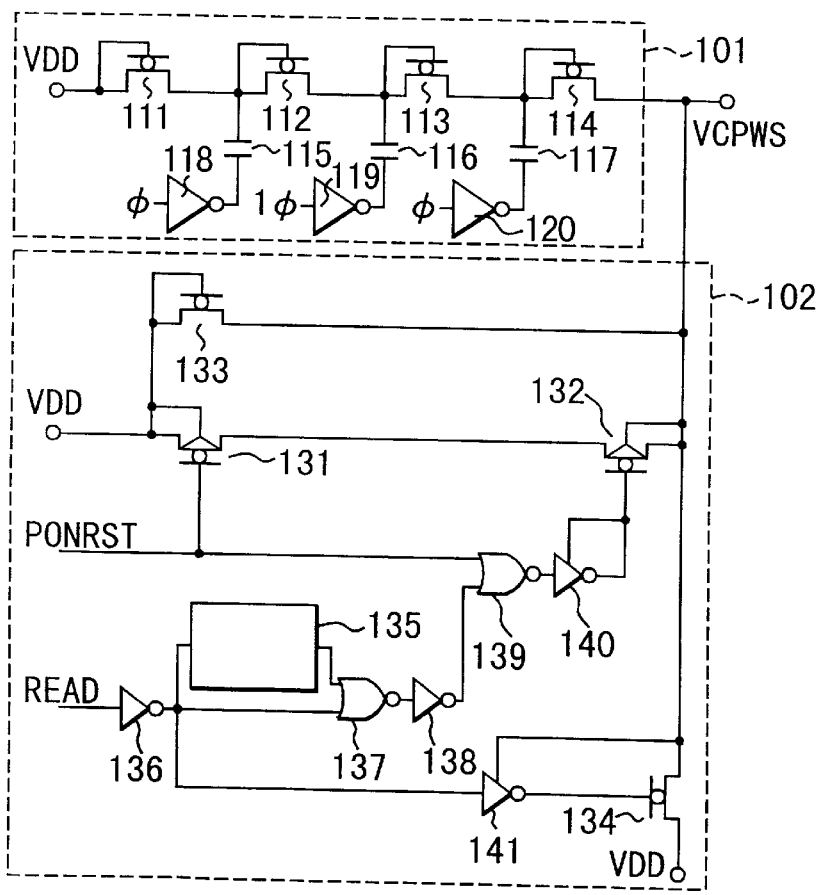
FIG. 5 is a view of a specific circuit configuration showing an embodiment of a boost circuit shown in FIG. 4.
Figure 6:
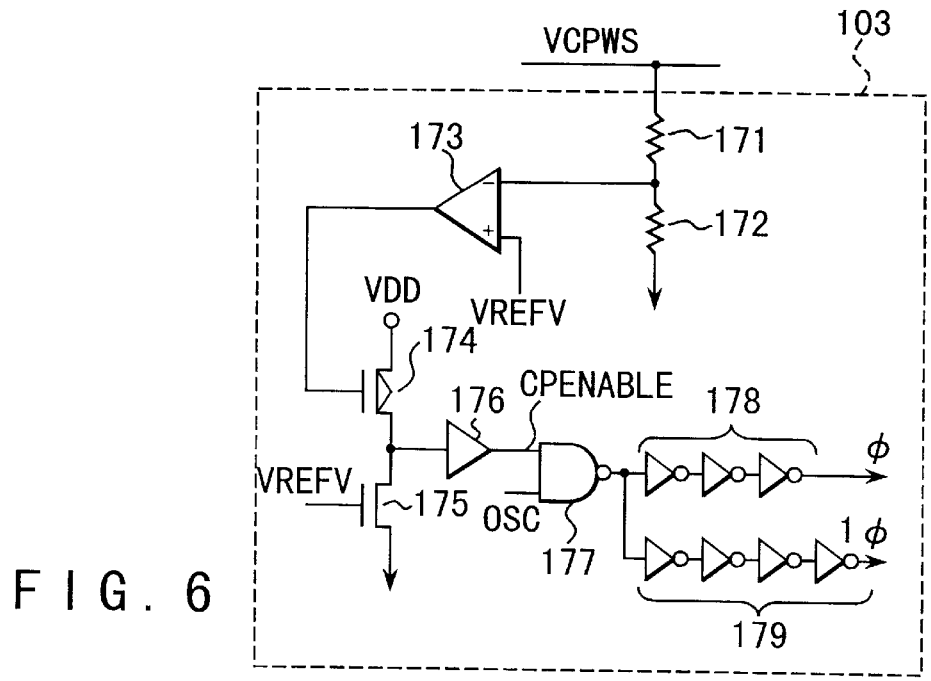
FIG. 6 is a view of a specific circuit configuration of a pulse generation circuit used for the boost circuit shown in FIG. 4.
Figure 7:
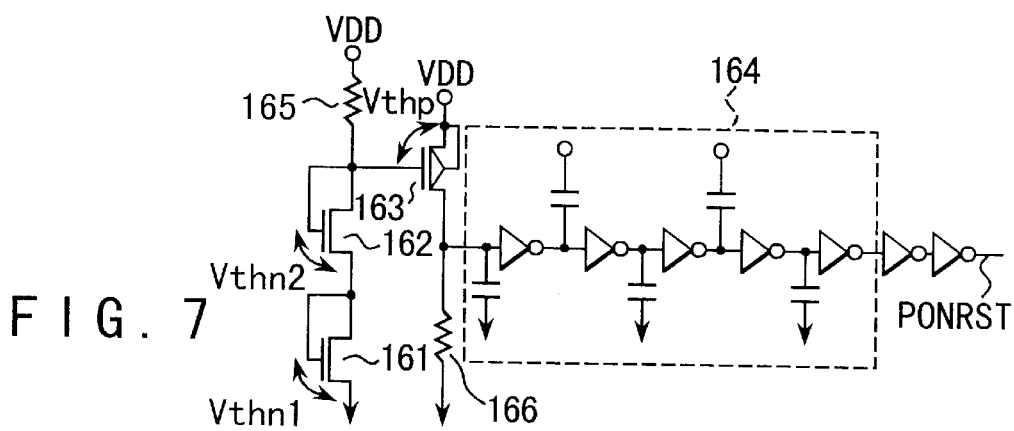
FIG. 7 is a view of a specific circuit configuration of a power-on reset circuit in the boost circuit shown in FIG. 4.

FIGS. 5, 6, and 7 show an example of a boost circuit 1. The boost circuit 1 consists of a charge pump 101 and a VDD switch circuit 102 shown in FIG. 5, a pulse generation circuit 103 shown in FIG. 6, as well as a power-on reset circuit shown in FIG. 7, for supplying the VDD switch circuit 102 with a power-on reset signal.

The charge pump 101 comprises NMOS-I type transistors 111 to 114, capacitors 115 to 117, and capacitor drive buffers 118 to 120. A symbol of $\phi$ denotes a pulse signal supplied from a pulse generation circuit 103, and a symbol of $/\phi$ denotes an inverted signal thereof.

A power potential VDD is supplied to a gate and a drain of a transistor 111. Sources of transistors 111, 112, and 113 are connected to both a gate and a drain of transistors 112, 113, and 114, respectively.

A source of the transistor 114 outputs a high potential VCPWS. In addition, input terminals of buffers 118, 119, and 120 are respectively supplied with signals $\phi$, /$\phi$, and $\phi$.

Output terminals of the buffer 118, 119, and 120 are connected to the drains of the transistors 112, 113, and 114 through capacitors 115, 116, and 117, respectively.

Although the charge pump circuit 101 described above consists of capacitors respectively arranged in three stages, the charge pump circuit 101 is not limited to this arrangement but the number of stages of capacitors can be optimized in accordance with the output potential VCPWS and the power source potential VDD.

FIG. 6 shows an example of a pulse generation circuit. The pulse generation circuit 103 serves to output signals $\phi$ and /$\phi$ to the charge pump 101 and to stop outputting these signals.

In this pulse generation circuit 103, resistors 171 and 172 are connected in series between the output terminal VCPWS of the boost circuit 1 and an earth, and the connection point between the resistors 171 and 172 is connected to an inverted input terminal of a calculation amplifier 173. A non-inverted input terminal of the calculation amplifier 173 is supplied with an output potential VREFV of a reference potential generation circuit 5.

An output terminal of the calculation amplifier 173 is connected to a gate of a PMOS transistor 174. A source of the PMOS transistor 174 is supplied with a power source potential VDD, and a drain thereof is connected to a drain of an NMOS transistor 175 and an input terminal of an inverter 176.

A gate of the NMOS transistor 175 is supplied with an output potential VREFV of the reference potential generation circuit 5, and a source of the NMOS transistor is grounded.

An output of the inverter 176 is connected to a first input terminal of an NAND gate 177. An output signal of the inverter 176 is called a CPENABLE. A second input terminal of the NAND gate 177 is supplied with a pulse signal OSC generated by an oscillator not shown.

An output terminal of the NAND gate 177 is connected to an input terminal of an inverter 178 consisting of, for example, three stages connected in series with each other and an input terminal of an inverter 179 consisting of, for example, four stages connected in series with each other. Output signals of the inverters 178 and 179 are respectively signal $\phi$ and /$\phi$.

In the next, a VDD switch circuit 102 shown in FIG. 5 will be explained below.

The VDD switch circuit 102 is a circuit for outputting a power source potential VDD to an output terminal when a charge pump 101 does not operate.

Figure 10:
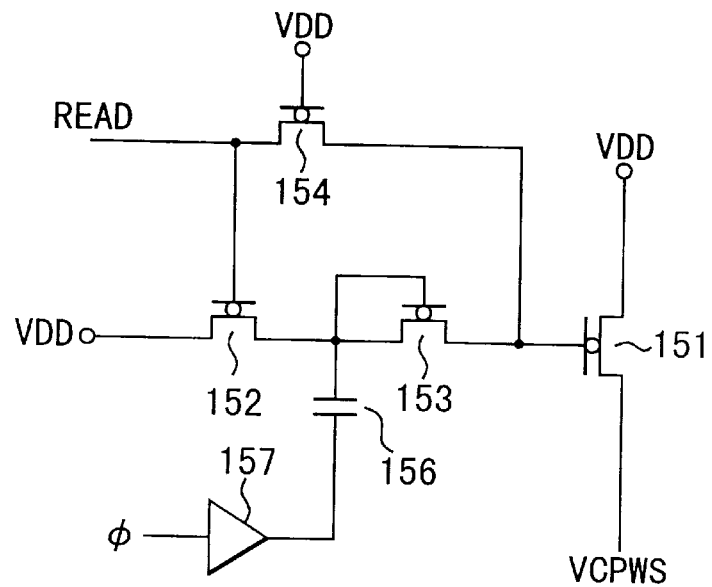
FIG. 10 shows an example of a VDD switch circuit used for a conventional boost circuit.

Meanwhile, a certain kind of conventional VDD switch circuit has, for example, a circuit configuration shown in FIG. 10.

An NMOS transistor 151 serves as a transfer gate for connecting an output terminal VCPWS with a power source potential VDD, and a charge pump consisting of NMOS-I type transistors 152 and 153, a capacitor 156, and a buffer 157 is provided in order to boost the gate of the transistor 151.

While the charge pump 101 operates, a signal READ is 0V and the gate potential of the transistor 151 is fixed to 0V through an NMOS transistor 154. Therefore, the transistor 151 is turned off and the output terminal VCPWS is separated from the power source potential VDD.

Meanwhile, while the charge pump 101 is in a stand-by state, the output potential VCPWS needs to be set to the power source potential VDD. Therefore, the charge pump of the VDD switch circuit must be operated in order to render the transistor 151 conductive.

Accordingly, the conventional VDD switch circuit 102 shown in FIG. 10 causes a problem that the stand-by current increases.

The VDD switch circuit 102 shown in FIG. 5 selves this problem. With use of PMOS transistors 131 and 132, the output terminal VCPWS and the power source VDD are connected with each other.

In this circuit, a power-on reset signal PONRST is supplied to the gate of the PMOS transistor 131 and a first input terminal of an NOR gate 139.

An output terminal of the NOR gate 139 is connected to an input terminal of a level shifter 140, and an output terminal of the level shifter 140 is connected to a gate of the PMOS transistor 132. A source of the PMOS transistor 131 and a substrate are supplied with a power source potential VDD, and a drain of the PMOS transistor 131 is connected to a drain of a PMOS transistor 132. A source and a well of the PMOS transistor 132 are connected to an output terminal VCPWS.

Meanwhile, a signal READ is supplied to an input terminal of an inverter 136. An output terminal of the inverter 136 is connected to an input terminal of a level shifter 141, and an output terminal of the level shifter 141 is connected to a gate of an NMOS-I type transistor 134. An end of a current path of the transistor 134 is supplied with a power source potential VDD, and another end of the current path is connected to the output terminal VCPWS.

In addition, an output terminal of the inverter 136 is connected to a first input terminal of an NOR gate 137 and an input terminal of a delay circuit 135. An output terminal of the delay circuit 135 is connected to a second input terminal of the NOR gate 137. An output terminal of the NOR gate 137 is connected to an input terminal of an inverter 138, and an output terminal of the inverter 138 is connected to a second input terminal of an NOR gate 139.

Here, power source terminals of the level shifters 140 and 141 are connected to the output terminal VCPWS. The level shifter 140 and 141 output inverted signals of input signals.

In addition, the power-on reset signal PONRST is of the same level as the power source potential when the power source VDD is turned on, and the power-on reset signal goes to 0V when a predetermined time has passed after the power is turned on.

FIG. 7 shows a power-on reset circuit for generating a signal PONRST.

In this power-on reset circuit, the source of an NMOS transistor 161 is grounded, and the gate and drain thereof are connected to the source of an NMOS transistor 162. The gate and drain of the transistor 162 are connected to a power source potential VDD through a resistor 165 and to the gate of a PMOS transistor 163. The source of the PMOS transistor 163 is supplied with a power source potential VDD, and the drain thereof is grounded through a resistor 166. In addition, the drain of the PMOS transistor 163 is connected to an input terminal of a delay circuit 164 consisting of an inverter of an odd-numbered stages and a capacitor. An output terminal of the delay circuit 164 outputs a signal PONRST through an inverter of, for example, two stages.

Figure 8:
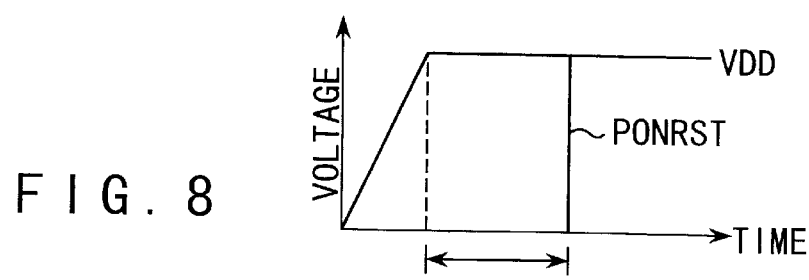
FIG. 8 is a view showing an operation characteristic of the power-on reset circuit shown in FIG. 7.

In the power-on reset circuit shown in FIG. 7, the signal PONRST goes to 0V when 100 nano seconds or more pass after the power source VDD completely rises, if the power source VDD has an early rise of about 100 nano seconds as shown in FIG. 8.

Figure 9:
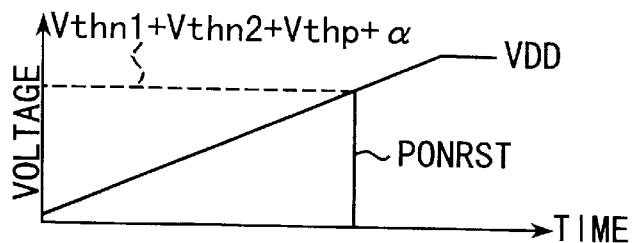
FIG. 9 is a view showing another operation characteristic of the power-on reset circuit shown in FIG. 7.

If the power source VDD has a late rise, the signal PONRST goes to 0V when the power source potential VDD rises to a level of Vthn1+Vthn2+Vthp+α, as shown in FIG. 9. Here, Vthn1, Vthn2, and Vthp are respectively threshold voltages of transistors 161, 162, and 163. The value of α is decided by the rising speeds of the delay circuit 164 and the power source VDD, and the value of α is 0 if the rising speed of the power source VDD is extremely low.

In the following, operation of the VDD switch circuit 102 shown in FIG. 5 will be explained below.

In this VDD switch circuit 102, a forward bias is generated between the potential of an N-well, i.e., the substrate potential and the potential of the drain as a P+ region, in the PMOS transistors 131 and 132. It is therefore necessary to prevent the forward bias from functioning as a trigger which will cause latching-up.

Therefore, in this circuit, countermeasures are respectively taken for a case where an output potential VCPWS is changed to a power source potential VDD when turning on the power and a case where the output potential VCPWS is lowered to the power source potential VDD after the charge pump 101 finishes operation.

At first, attention should be paid so that a forward bias might not occur between the drain and the N-well of the PMOS transistor 132 when turning on the power. Therefore, after turning on the power, the PMOS transistor 131 is turned off by a signal PONRST. While the transistor 131 is turned off, the output terminal VCPWS is charged to the potential of VDD−Vthni by an NMOS-I type transistor 133. Here, Vthni denotes a threshold voltage of the NMOS-I type transistor 133.

Once the output terminal VCPWS is charged, the signal PONRST is changed to 0V, and the PMOS transistor 131 is turned on. Further, if a signal READ is of a high level, a PMOS transistor 132 is rendered conductive, so that the power source potential VDD and the output terminal VCPWS are completely connected with each other at a low resistance. In addition, if the charge pump 101 is operating, the signal READ is of a low level and the gate potential of the PMOS transistor 132 is of a high level, so that the transistor 132 is turned off.

Note that the PMOS transistor 131 is turned on before the power source VDD completely rises, if the rising speed of the power source VDD is low as shown in FIG. 9. However, charging of the output terminal VCPWS by the NMOS-I type transistor 133 can sufficiently follow the rise of the power source VDD, so that the potential of the output terminal VCPWS is unlimitedly close to the level of the VDD−Vthni. Therefore, the potential applied between the drain and the well of the PMOS transistor 132 is about Vthni. Since the value of the Vthni is smaller than the forward direction voltage of about 0.7V, the potential difference between the drain and the well of the transistor 132 is 0.7V or less, so that a risk of latching-up can be avoided.

In the next, explanation will be made to a case in which the charge pump 101 terminates operation of itself and the output potential VCPWS is lowered to the power source potential VDD.

At the instance when the charge pump 101 stops operating, the output potential VCPWS is higher than the power source potential VDD. In this state, the PMOS transistor 132 is turned on by a signal READ of a high level, and then, a forward bias is generated between the drain and the well of the PMOS transistor 131.

In order to avoid such a forward bias, the signal READ goes to a high level, at first, thereby turning on the NMOS-I type transistor 134, so that the output potential VCPWS is lowered to a value of VDD+Vthni. Here, Vthni denotes the threshold voltage of the transistor 134. After lowering the potential, the PMOS transistor 132 is turned on to completely connect the power source potential with the VCPWS. The time required until the PMOS transistor 132 is turned on after the signal READ reaches the high level can be decided by the delay circuit 135.

Thus, according to the VDD switch circuit 102 of the present invention, the power consumption is reduced and latching-up does not occur when turning on the power and when a power source potential VDD is connected to an output terminal of a boost circuit.

Note that the problem of a forward bias generated between a drain and a well of a PMOS transistor 132 when turning on the power is more significant than the problem of a forward bias generated between a drain and a well of a PMOS transistor 131 when a charge pump 101 stops operating. Therefore, in the VDD switch circuit 102 shown in FIG. 3, a delay circuit 135, an NOR gate 137, an inverter 138, and an NOR gate 139 can be omitted, and it is possible to provide a level shifter circuit which has an input terminal supplied with a power-on reset signal PONRST, an output terminal connected to a gate of a PMOS transistor 132, and a power source terminal connected to an output terminal VCPWS, and which outputs a positive signal of an input signal, i.e., a power-on reset signal PONRST, in place of an inverter 140. In this case, the problem of latching-up when turning on the power is solved.

A boost circuit 2 is a circuit similar to the charge pump 101 shown in FIG. 3.

Figure 11:
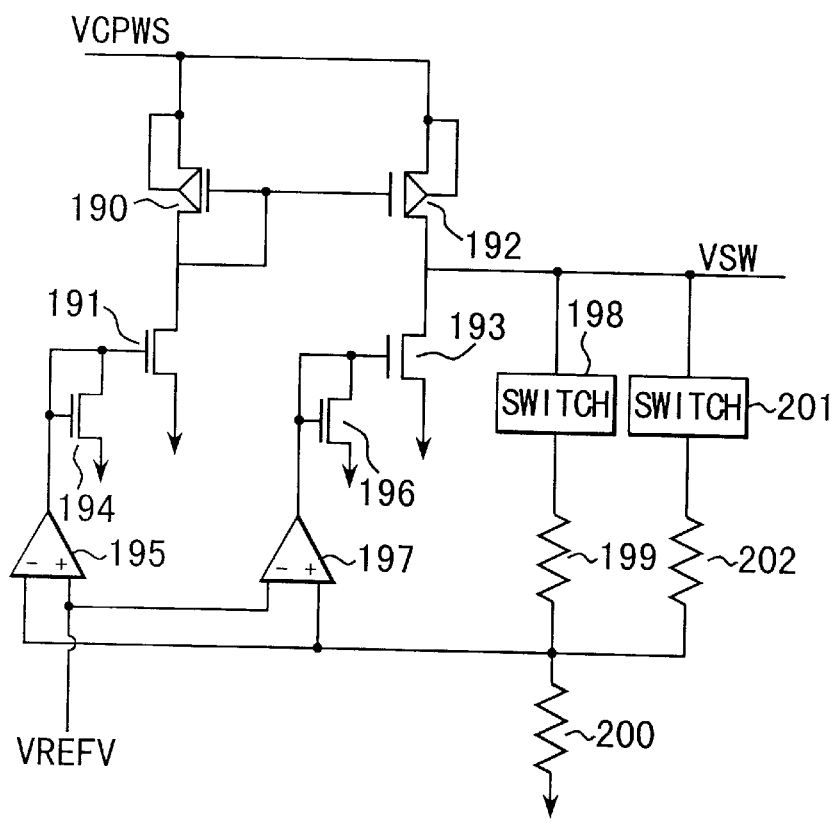
FIG. 11 is a view of a specific circuit configuration of an embodiment of a stepdown circuit shown in FIG. 4.

FIG. 11 shows a circuit configuration of a stepdown circuit 3. A circuit similar to that shown in FIG. 3 is used as a stepdown circuit 4.

An output potential VCPWS of a boost circuit 1 is supplied to the source of a PMOS transistor 190 and the source and well of a PMOS transistor 192. The gate of the PMOS transistor 190 is connected to the gate of the PMOS transistor 192, the drain of the PMOS transistor 190, and the drain of an NMOS transistor 191. The source of the NMOS transistor 191 is grounded. The drain of the PMOS transistor 192 is connected to an output terminal of a stepdown circuit 3 and the drain of an NMOS transistor 193. The source of the NMOS transistor 193 is grounded.

The output terminal VSW is connected to a first terminal of a switch 198, and a second terminal of the switch 198 is connected to a first terminal of a resistor 199. A second terminal of the resistor 199 is connected to a first terminal of a resistor 200, and a second terminal of the resistor 200 is grounded.

In addition, a second terminal of the resistor 199 is connected to an inverted input terminal of a calculation amplifier 195 and a non-inverted input terminal of a calculation amplifier 197. A non-inverted input terminal of the calculation amplifier 195 and an inverted input terminal of the calculation amplifier 197 are both supplied with an output potential VREFV of a reference potential generation circuit 5.

An output terminal of the calculation amplifier 195 is connected to the gate and drain of an NMOS transistor 194, and the gate of the NMOS transistor 191. The source of the NMOS transistor 194 is grounded. Likewise, an output terminal of the calculation amplifier 197 is connected to the gate and drain of an NMOS transistor 196 and the gate of the NMOS transistor 193. The source of the NMOS transistor 196 is grounded.

In this circuit, suppose that the output potential VCPWS is 12V, the reference potential VREFV is 2V, and the ratio of the resistance value of a resistor 199 to that of a resistor 200 is 2:1. In this case, when switches 198 and 201 are opened, the output potential VSW is 12V. When the switch 198 is closed, the output potential VSW is 6V. This output potential VSW is stable and includes less changes in potential.

Further, a first terminal of the switch 201 is connected to the output terminal VSW and a first terminal of a resistor 202 is connected to a second terminal of the switch 201. The second terminal of the resistor 202 is connected to a first terminal of the resistor 200.

In this circuit, several kinds of stepdown potentials can be generated by controlling the switches 198 and 201.

In addition, as shown in FIG. 12, it is possible to provide a resistor 203 between the second terminal of the switch 201 and the first terminal of the resistor 199, in place of the resistor 202 shown in FIG. 11. In case of this arrangement, in comparison with the circuit shown in FIG. 11, the switch 201 commonly holds a high resistance defined by summing resistances of resistors 199 and 203 together, so that the same effects as those obtained by the circuit shown in FIG. 11 can be obtained.

FIG. 13 shows a circuit configuration of a reference potential generation circuit 5.

In this reference potential generation circuit, sources of PMOS transistors 301, 302, and 303 are supplied with a power source potential VDD. The gate of the PMOS transistor 301 is connected to the gate and drain of the PMOS transistor 302 and the gate of the PMOS transistor 303. The drain of the PMOS transistor 301 is connected to the drain and gate of an NMOS-E type transistor 304 and the gate of an NMOS-I type transistor 305 having a threshold voltage Vth lower than the NMOS-E type transistor. The source of the transistor 304 is grounded and the source of the transistor 305 is grounded through a resistor 306 having a resistance value R1.

Further, the potential of the drain of the PMOS transistor 303 also serves as the output potential VREFV of the reference potential generation circuit 5. For example, four resistors 307 to 310 are connected in series between the drain of the PMOS transistor 303 and an earth. Suppose that R2 denotes the sum of resistance values of the resistors not short-circuited by the transistors 311 to 313. First and second terminals of current paths of the transistors 311, 312, and 313 are respectively connected to first and second terminals of the resistors 308, 309, and 310. The gates of the transistors 311, 312, and 313 are respectively supplied with signals TRIM1, TRIM2, and TRIM3.

In this circuit, the PMOS transistors 301 to 303 have an equal size and currents flowing through these transistors are equal to each other. Supposing that threshold voltages of the NMOS-E type transistor 304 and the NMOS-I type transistor 305 are respectively denoted by Vthne and Vthni, the potential VR at the connection point between the source of the transistor 305 and the resistor 306 is close to a value expressed as Vthne−Vthni. Therefore, the reference potential VREFV is obtained by (R2/R1)×(Vthne−Vthni).

However, since this circuit is weak against a process dispersion of, for example, a threshold voltage Vth or the like, the transistors 311, 312, and 313 are turned on or off by trimming signals TRIM1 to TRIM3 based on fuse data, thereby making a fine adjustment to the value of R2 to prepare an optimal value of the VREFV.

Figure 14:
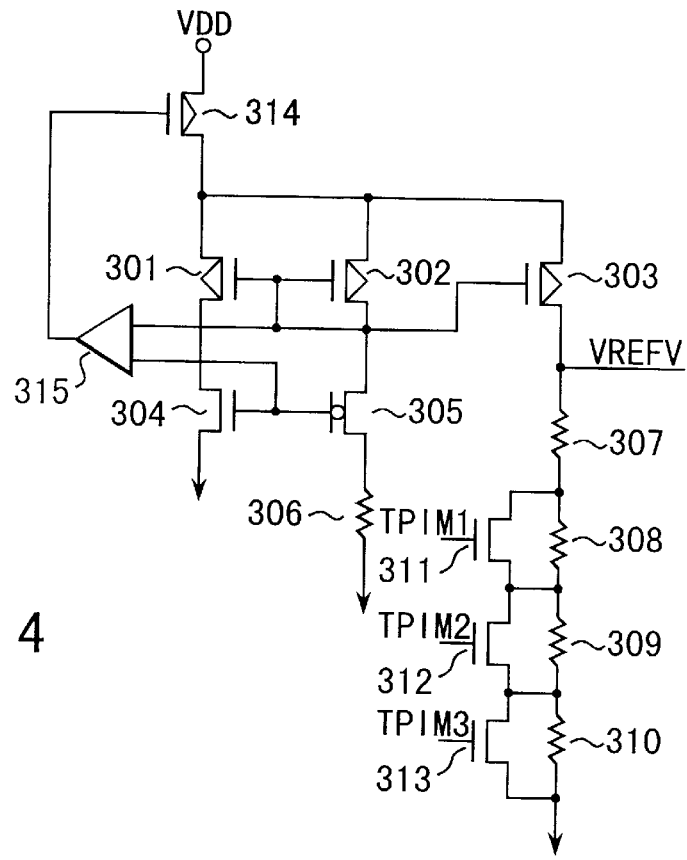
FIG. 14 is a view of a specific circuit configuration of a reference potential generation circuit shown in FIG. 4.

FIG. 14 shows a second example of a circuit configuration of a reference potential generation circuit 5.

This circuit is constructed by adding a PMOS transistor 314 and a calculation amplifier 315 to the circuit shown in FIG. 13. Specifically, the sources of the PMOS transistors 301 and 302 are connected to the drain of the PMOS transistor 314, in place of a power source potential VDD, and the source of the PMOS transistor 314 is connected to the power source potential VDD.

In addition, in the calculation amplifier 315, a non-inverted input terminal is connected to the drain of the PMOS transistor 302 while an inverted input terminal is connected to the drain of the PMOS transistor 301, and an output terminal is connected to the gate of the PMOS transistor 314.

In this reference potential generation circuit, a calculation amplifier 315 and a PMOS transistor 314 are provided, and therefore, changes in the output potential VREFV in accordance with changes in the power source potential VDD are smaller than those in the circuit shown in FIG. 13 since the PMOS transistor 314 serves as a low current source.

Figure 15:
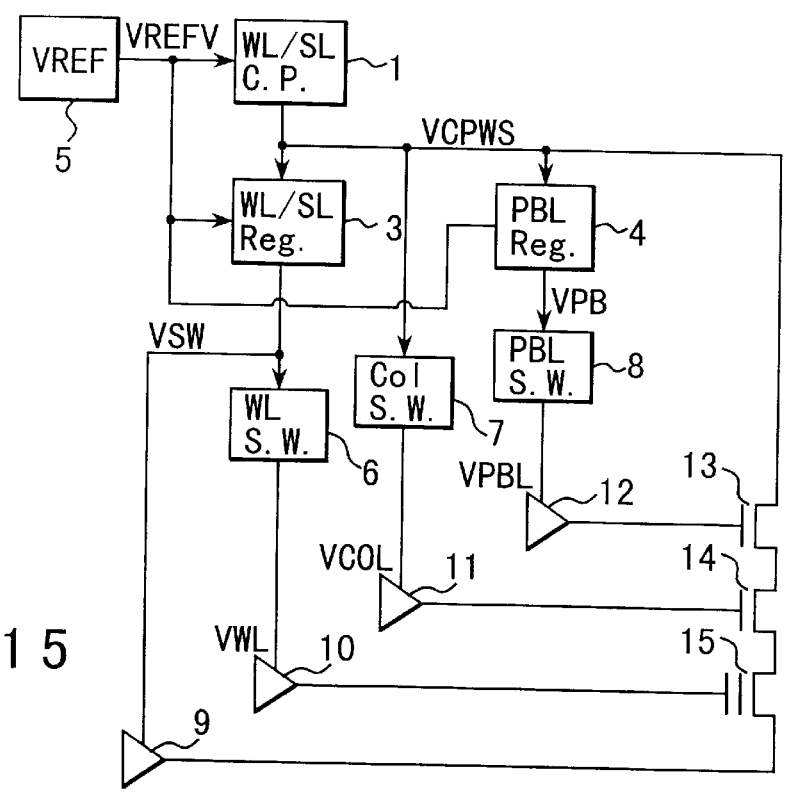
FIG. 15 is a view of a circuit configuration showing a second embodiment of a power source circuit used for a non-volatile semiconductor memory according to the present invention.

Further, as shown in FIG. 15, it is possible to remove the boost circuit BL C. P. 2 from the embodiment shown in FIG. 4 and to supply the drain of the write transistor 13 with an output potential VCPWS of the boost circuit WL/SL C. P. 1, instead. In this case, the drain potential of the memory cell 15 is set to an optimal value by adjusting the threshold voltage of the write transistor 13 and the potential supplied to the gate thereof. Use of this reference voltage generation circuit is not limited to those as described above, but this circuit can be used as a low potential source for a logic circuit or as a reference power source for a limiter of a charge pump when applying a potential to a word line in a DRAM.

In the embodiment shown in FIG. 15, the same advantages of the embodiment shown in FIG. 4 can be obtained with the chip area reduced to be smaller than that of the embodiment shown in FIG. 4.

In the power source circuit system shown in FIG. 4, only the output potential VSW of a stepdown circuit 3 is prepared as a potential to be applied to a word line of the memory cell 15. Therefore, only the potential VSW or an external power source potential VDD can be used as a word line potential for a reference cell when reading or verifying data.

In case where a potential other than the above should be applied to the word line of the reference cell when verifying data, there is a case in which a word line power source for a reference cell is provided independently.

FIG. 16 shows a second embodiment of the present invention which is provided with a word line power source.

This circuit is constructed by adding a stepdown circuit RWL Reg. 16 for generating a potential applied to the gate of a reference cell 19, a power source switch circuit RWL SW 17, and a row decoder circuit 18 for the reference cell, to the first embodiment shown in FIG. 4.

The stepdown circuit RWL Reg. 16 has an input terminal supplied with an output potential VREFV of a reference potential generation circuit 5 and a power source potential VDD not shown, and outputs a potential VRWL obtained by lowering the power source potential VDD.

The stepdown circuit 16 is similar to the circuits of the stepdown circuits 3 and 4 shown in FIG. 11. The output potential VRWL of the circuit 16 is used as a gate potential for a reference cell 19 when verifying data after writing or erasing data in a cell.

Although the potential VRWL is generated by lowering the power source potential VDD, an output potential VCPWS of a boost circuit 1 in place of the power source potential VDD is supplied to the input terminal and the output potential VCPWS is lowered to generate the output potential VRWL, in case where a potential higher than the power source potential VDD should be obtained.

In the power switch circuit 17, the input terminal is supplied with the output potential VRWL of the stepdown circuit 16 and the power source potential VDD, and the output terminal is connected to the power source terminal VRFWL of a row decoder circuit 18 for a reference cell 19. The power source switch circuit 17 selects and outputs the potential VRWL or the power source potential VDD in accordance with the operation state of the reference cell 19.

An output terminal of the row decoder 18 is connected to a gate of the reference cell 19. In the figure, a symbol of S/A denotes a sense amplifier circuit.

In this embodiment, there is provided a stepdown circuit 16 for generating a potential used for reference cell 19 when verifying data after writing or erasing data in a memory cell 15, with use of the power source potential VDD or the output potential VCPWS of the boost circuit 1, in addition to boost circuits 1 and 2. Therefore, a power source circuit can be constructed without use of an external high voltage power source.

Further, in the power source circuit systems shown in FIGS. 4 and 16, the reliability of a cell can be improved or a reading margin of an off-cell, i.e., a cell into which data has been written can be improved, by controlling the word line power source VWL to be a certain level or a lower level.

In this case, since a stepdown circuit 3 operates, it is necessary to make the reference potential generation circuit 5 operate when reading operation is performed. Here, taking into consideration that the reading speed Tce from a stand-by state requires several tens nano seconds, the rising time of the reference potential generation circuit 5 must be reduced to 10 nano seconds or less to immediately generate a stable reference potential.

However, since it is very difficult to realize a reference potential generation circuit having an extremely short rising time, it may be possible to think of a method of make the reference potential generation circuit operate from a time point in a stand-by state.

This method has a problem that the stand-by current is increased, and therefore, it is required to reduce, as much as possible, the operation current of the reference potential generation circuit. However, a current reduced too much will lead to a problem in the stability of the reference potential.

Therefore, the power source circuit is provided with both a normal reference potential generation circuit and a reference potential generation circuit of a low power consumption type.

Figure 18:
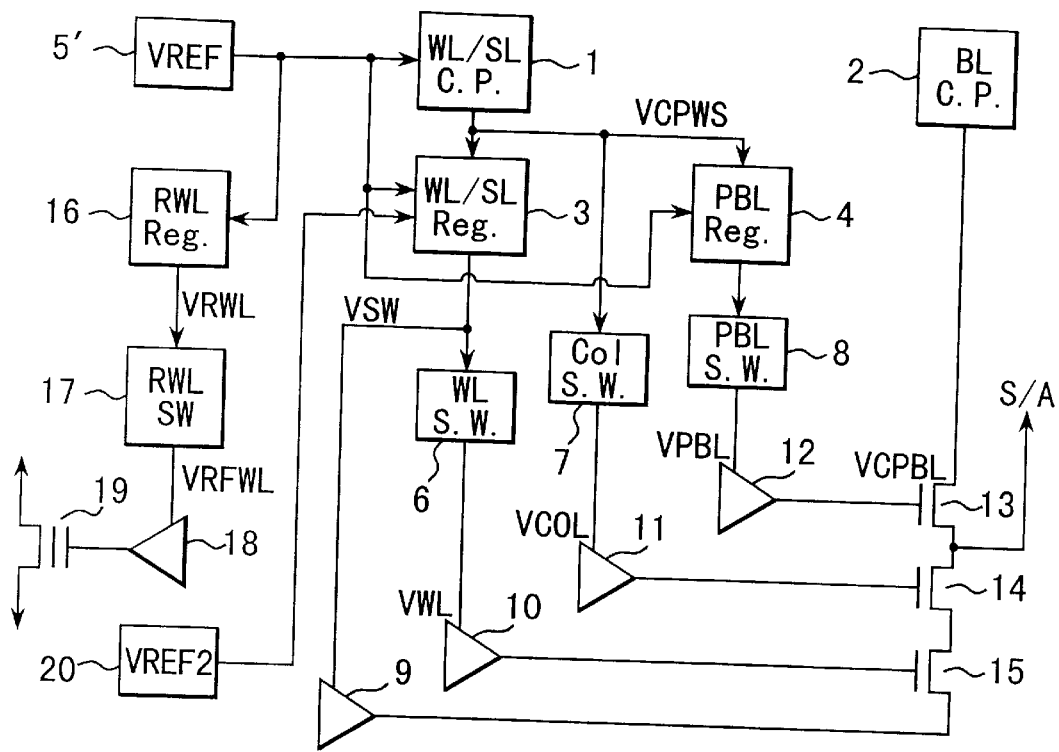
FIG. 18 is a view of a circuit configuration showing a fourth embodiment of a power source circuit used for a non-volatile semiconductor memory according to the present invention.
Figure 21:
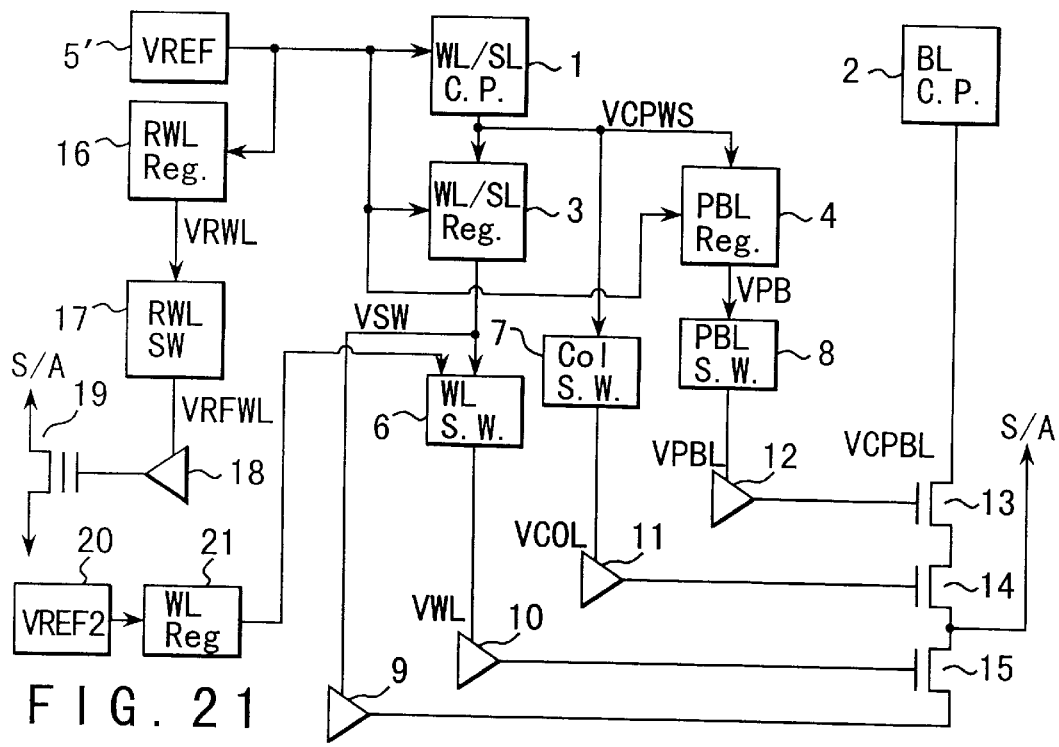
FIG. 21 is a circuit configuration showing a fifth embodiment of the power source circuit used for a non-volatile semiconductor memory according to the present invention.

FIGS. 18 and 21 respectively show third and fourth embodiments of the present invention, which adopt both a normal reference potential generation circuit and a reference potential generation circuit of a low power consumption type.

The embodiment shown in FIG. 18 is constructed by adding a low power consumption type reference potential generation circuit VREF2 20 to the embodiment shown in FIG. 16. Further, a reference potential generation circuit 5' which stops operating in a stand-by state is provided in place of the reference potential generation circuit 5 shown in FIG. 16.

In the reference potential generation circuit 20, the output terminal is connected to an input terminal of a stepdown circuit 3. Although the reference potential generation circuit 20 is similar to the circuits shown in FIGS. 13 and 14, the current consumption is reduced by reducing the size of transistors while increasing resistance values.

Further, in the stepdown circuit 3, for example, switching is performed in a manner in which an output potential of the reference potential generation circuit 5' is normally used as a reference potential and an output potential of the low power consumption type reference potential generation circuit 20 is used when reading data from a cell.

Figure 19:
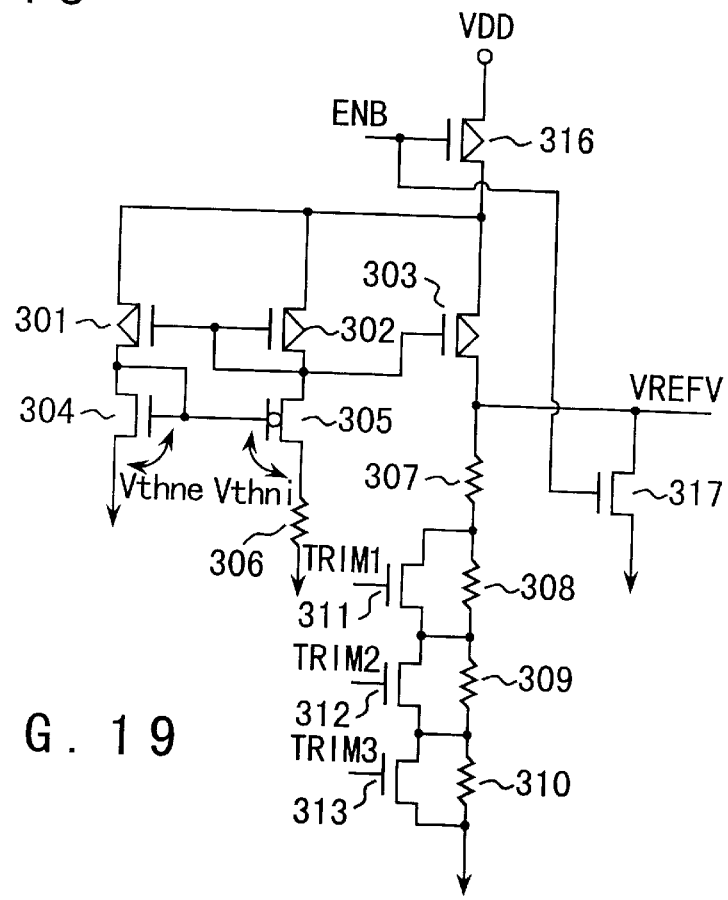
FIG. 19 is a view of a specific circuit configuration showing a third embodiment of a reference potential generation circuit shown in FIG. 4.
Figure 20:
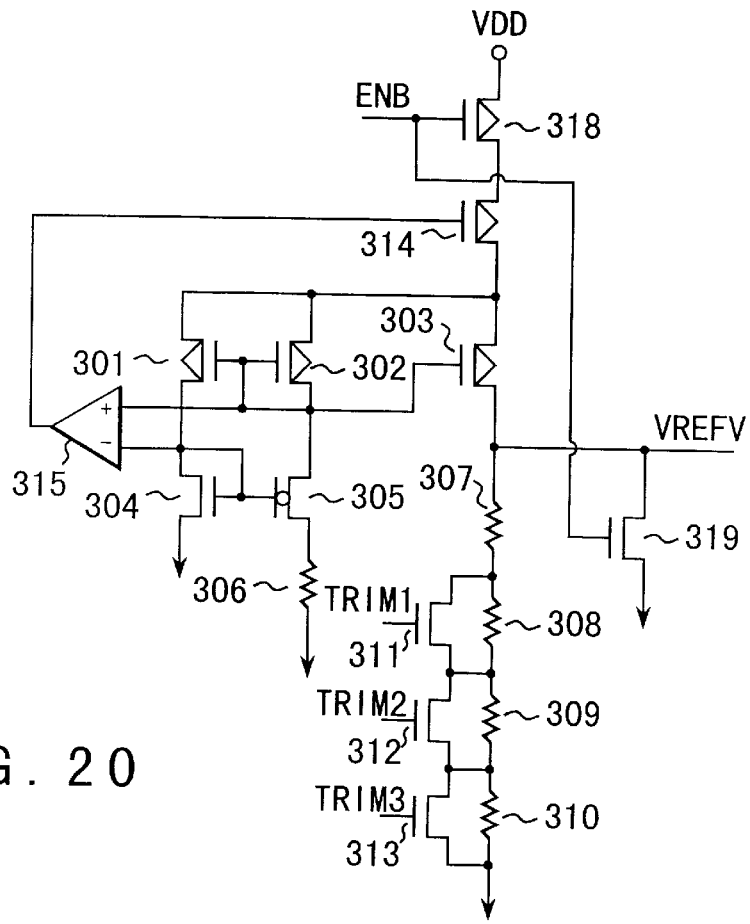
FIG. 20 is a view of a specific circuit configuration showing a fourth embodiment of the reference potential generation circuit shown in FIG. 4.

FIGS. 19 and 20 show examples of circuit configurations of the reference potential generation circuit 5' which stops operating in a stand-by state.

The circuit shown in FIG. 19 is constructed by adding a PMOS transistor 316 and an NMOS transistor 317 to the reference potential generation circuit shown in FIG. 13.

A signal ENB is supplied to the gate of the PMOS transistor 316 and the gate of the NMOS transistor 317. The sources of PMOS transistors 301, 302, and 303 are connected to the drain of the PMOS transistor 316, in place of a power source potential VDD. The source of the PMOS transistor 316 is connected to the power source potential VDD. The drain of the NMOS transistor 317 is connected to the drain of the PMOS transistor 303, and the source of the NMOS transistor 317 is grounded.

Meanwhile, the circuit shown in FIG. 20 is constructed by adding a PMOS transistor 318 and an NMOS transistor 319 to the reference potential generation circuit shown in FIG. 14.

In FIG. 20, a signal ENB is supplied to the gate of the PMOS transistor 318 and the gate of the NMOS transistor 319. The source of a PMOS transistor 314 is connected to the drain of the PMOS transistor 318, in place of the power source potential VDD, and the source of the PMOS transistor 318 is connected to the power source potential VDD.

In addition, the drain of the NMOS transistor 319 is connected to the drain of the PMOS transistor 303, and the source of the NMOS transistor 319 is grounded.

The reference potential generation circuits shown in FIGS. 19 and 20 are brought into an operating state when the signal ENB is of a low level, and these circuits stop operating when the signal ENB goes to a high level.

In the present embodiments, the lower power consumption type reference potential generation circuit always operates and is capable of responding to reading data from a cell. In addition, since the reference potential generator circuit 5' operates only when required, the power consumption can be reduced.

An embodiment shown in FIG. 21 is constructed by adding a low power consumption type reference potential generation circuit VREF2 20 and a stepdown circuit WL Reg. 21 to the embodiment shown in FIG. 16 and by providing a reference potential generation circuit 5' for stopping operating in a stand-by state, in place of the reference potential generation circuit 5.

In this embodiment, an output terminal of the reference potential generation circuit 20 is connected to an input terminal of the stepdown circuit 21.

An output terminal of the stepdown circuit 21 is connected to an input terminal of the power source switch circuit 6. The stepdown circuit 21 is a circuit similar to a stepdown circuit 3, and lowers and outputs the power source potential VDD.

This embodiment is arranged so as to independently separate the function of generating a word line potential when reading data, from the stepdown circuit 3.

A power switch circuit 6 has an input terminal supplied with output potentials of the stepdown circuits 3 and 21 and the power source potential VDD, and selects and outputs one of the three potentials in accordance with the state of the cell, i.e., a state in which data is written into the cell, a state in which data is read therefrom, a state in which data is erased therefrom, or a state in which data is verified therefrom.

In this embodiment, since a WL Reg. 21 is provided such that the circuit serves as limiter by which no higher voltage than 5V is applied to to the word line, the reliability of the cell can be improved.

As has been explained above, according to the present invention, a boost circuit which generates a high potential is provided in a semiconductor integrated circuit, and therefore, cell data can be written, erased, and verified without use of an external high voltage power source.

In addition, since a stepdown circuit for a reference cell is provided, it is possible to perform verification on a reference cell with use of a gate potential different from that for a memory cell.

Further, since a reference potential generation circuit which is turned off in a stand-by state and a low power consumption reference potential generation circuit which constantly operates are provided, it is possible to immediately make a stepdown circuit operate while reducing the power consumption.

Although the above embodiments have been explained with reference to examples in which a power source circuit device is used for a non-volatile semiconductor memory, the present invention can also be used as a power source circuit device for the other kinds of memories.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

I claim:

1. A power source circuit device comprising:
   a reference potential generation circuit for outputting a reference potential;
   a first boost circuit having an input terminal supplied with the reference potential, for outputting either a power source potential VDD or a first high voltage potential generated;
   a second boost circuit for generating and outputting a second high voltage potential used for a drain potential of a write transistor;
   a first stepdown circuit having an input terminal supplied with the output potential of the first boost circuit and the reference potential, for outputting either a potential obtained by lowering the output potential of the first boost circuit or the output potential of the first boost circuit, to be used for a gate potential and a source potential of a memory cell;
   a second stepdown circuit having an input terminal supplied with the output potential of the first boost circuit and the reference potential, for outputting a potential obtained by lowering the output potential of the first boost circuit, to be used for a gate potential of the write transistor;
   at least one first power switch circuit 6 having an input terminal supplied with the first stepdown circuit, for outputting either the output potential of the first stepdown circuit or the power source potential, to be used for the gate potential of the memory cell;
   a second power switch circuit having an input terminal supplied with the output potential of the first boost circuit, for outputting either the output potential of the first boost circuit or the power source potential, to be used for a gate potential of a column select transistor;
   a third power source switch circuit having an input terminal supplied with the output potential of the second stepdown circuit, for outputting either the output potential of the second stepdown circuit or the power source potential, to be used for the gate potential of the write transistor;
   a cell source decoder having a power source terminal supplied with the output potential of the first stepdown circuit;
   a row decoder circuit having at least one power source terminal respectively supplied with the output potential of the at least one power switch circuit;
   a column decoder having a power source terminal supplied with the output potential of the second power source switch circuit; and
   a write transistor decoder circuit having a power source terminal supplied with the output potential of the third power source switch circuit.

2. A power source circuit device used for a non-volatile semiconductor memory, according to claim 1, wherein the first boost circuit comprises:
   a charge pump circuit for outputting a high voltage potential to an output terminal of a boost circuit;
   a power-on reset circuit for outputting a power-on reset signal which goes to a low level from a power source potential when a predetermined time passes after turning on a power source;
   an NMOS-I type transistor having a source connected to an output terminal of the boost circuit, and a drain and a gate connected to the power source potential VDD;
   a first PMOS transistor having a source and a well connected to the power source potential VDD, and a gate supplied with the power-on reset signal;
   a second PMOS transistor having a source and a well connected to the output terminal of the boost circuit, and a drain connected to a drain of the first PMOS transistor; and
   a level shifter circuit having an input terminal supplied with the power-on reset signal, a power source terminal connected to the output terminal of the boost circuit, and an output terminal connected to the second PMOS transistor.

3. A power source circuit device used for a non-volatile semiconductor memory, according to claim 1, wherein the first boost circuit comprises:
   a charge pump circuit for outputting a high voltage potential to an output terminal of a boost circuit;
   a power-on reset circuit for outputting a power-on reset signal which goes to a low level from a power source potential when a predetermined time passes after turning on a power source;
   a first NMOS-I type transistor having a source connected to an output terminal of the boost circuit, and a drain and a gate connected to the power source potential VDD;

a first PMOS transistor having a source and a well connected to the power source potential VDD, and a gate supplied with the power-on reset signal;

a second PMOS transistor having a source and a well connected to the output terminal of the boost circuit, and a drain connected to a drain of the first PMOS transistor;

a first level shifter circuit having an input terminal supplied with an inverted signal of a read signal, and a power source terminal connected to the output terminal of the boost circuit, for outputting an inverted signal of an input signal;

a second NMOS-I type transistor having a gate connected to an output terminal of the first level shifter, a source connected to the power source potential VDD, and a drain connected to the output terminal of the boost circuit;

a delay circuit having an input terminal supplied with the inverted signal of the read signal;

a first NOR gate having a firs input terminal connected to an output terminal of the delay circuit, and a second input terminal supplied with the inverted signal of the read signal;

a second NOR gate having a first input terminal supplied with the power-on reset signal, and a second input terminal supplied with an inverted signal of an output signal of the first NOR gate; and a second level shifter having an input terminal connected with an output terminal of the second NOR gate, a power source terminal connected to the output terminal of the boost circuit, and an output terminal connected to a gate of the second PMOS transistor, for outputting an inverted signal of an input signal.

4. A power source circuit device comprising:

a reference potential generation circuit for outputting a reference potential;

a first boost circuit having an input terminal supplied with the reference potential, for outputting either a power source potential VDD or a first high voltage potential generated, and for supplying the first high voltage potential as a drain potential for a write transistor;

a first stepdown circuit having an input terminal supplied with the output potential of the first boost circuit and the reference potential, for outputting either a potential obtained by lowering the output potential of the first boost circuit or the output potential of the first boost circuit, to be used for a gate potential and a source potential of a memory cell;

a second stepdown circuit having an input terminal supplied with the output potential of the first boost circuit and the reference potential, for outputting a potential obtained by lowering the output potential of the first boost circuit, to be used for a gate potential of the write transistor;

at least one first power switch circuit having an input terminal supplied with the first stepdown circuit, for outputting either the output potential of the first stepdown circuit or the power source potential, to be used for the gate potential of the memory cell;

a second power switch circuit having an input terminal supplied with the output potential of the first boost circuit, for outputting either the output potential of the first boost circuit or the power source potential, to be used for a gate potential of a column select transistor;

a third power source switch circuit having an input terminal supplied with the output potential of the second stepdown circuit, for outputting either the output potential of the second stepdown circuit or the power source potential, to be used for the gate potential of the write transistor;

a cell source decoder having a power source terminal supplied with the output potential of the first stepdown circuit;

a row decoder circuit having at least one power source terminal respectively supplied with the output potential of the at least one power switch circuit;

a column decoder having a power source terminal supplied with the output potential of the second power source switch circuit; and a write transistor decoder circuit having a power source terminal supplied with the output potential of the third power source switch circuit.

5. A power source circuit device used for a non-volatile semiconductor memory, according to claim 4, wherein the first boost circuit comprises:

a charge pump circuit for outputting a high voltage potential to an output terminal of a boost circuit;

a power-on reset circuit for outputting a power-on reset signal which goes to a low level from a power source potential when a predetermined time passes after turning on a power source;

an NMOS-I type transistor having a source connected to an output terminal of the boost circuit, and a drain and a gate connected to the power source potential VDD;

a first PMOS transistor having a source and a well connected to the power source potential VDD, and a gate supplied with the power-on reset signal;

a second PMOS transistor having a source and a well connected to the output terminal of the boost circuit, and a drain connected to a drain of the first PMOS transistor; and a level shifter circuit having an input terminal supplied with the power-on reset signal, a power source terminal connected to the output terminal of the boost circuit, and an output terminal connected to the second PMOS transistor.

6. A power source circuit device used for a non-volatile semiconductor memory, according to claim 4, wherein the first boost circuit comprises:

a charge pump circuit for outputting a high voltage potential to an output terminal of a boost circuit;

a power-on reset circuit for outputting a power-on reset signal which goes to a low level from a power source potential when a predetermined time passes after turning on a power source;

a first NMOS-I type transistor having a source connected to an output terminal of the boost circuit, and a drain and a gate connected to the power source potential VDD;

a first PMOS transistor having a source and a well connected to the power source potential VDD, and a gate supplied with the power-on reset signal;

a second PMOS transistor having a source and a well connected to the output terminal of the boost circuit, and a drain connected to a drain of the first PMOS transistor;

a first level shifter circuit having an input terminal supplied with an inverted signal of a read signal, and a power source terminal connected to the output terminal of the boost circuit, for outputting an inverted signal of an input signal;

a second NMOS-I type transistor having a gate connected to an output terminal of the first level shifter, a source connected to the power source potential VDD, and a drain connected to the output terminal of the boost circuit;

a delay circuit having an input terminal supplied with the inverted signal of the read signal;

a first NOR gate having a firs input terminal connected to an output terminal of the delay circuit, and a second input terminal supplied with the inverted signal of the read signal;

a second NOR gate having a first input terminal supplied with the power-on reset signal, and a second input terminal supplied with an inverted signal of an output signal of the first NOR gate; and a second level shifter having an input terminal connected with an output terminal of the second NOR gate, a power source terminal connected to the output terminal of the boost circuit, and an output terminal connected to a gate of the second PMOS transistor, for outputting an inverted signal of an input signal.

7. A power source circuit device comprising:

a reference potential generation circuit for outputting a reference potential;

a first boost circuit having an input terminal supplied with the reference potential, for outputting either a power source potential VDD or a first high voltage potential generated;

a second boost circuit for generating and outputting a second high voltage potential used for a drain potential of a write transistor;

a first stepdown circuit having an input terminal supplied with the output potential of the first boost circuit and the reference potential, for outputting either a potential obtained by lowering the output potential of the first boost circuit or the output potential of the first boost circuit, to be used for a gate potential and a source potential of a memory cell;

a second stepdown circuit having an input terminal supplied with the output potential of the first boost circuit and the reference potential, for outputting a potential obtained by lowering the output potential of the first boost circuit, to be used for a gate potential of the write transistor; and a third stepdown circuit having an input terminal supplied with the reference potential, for outputting a potential obtained by lowering the power source potential VDD, to be used for a gate potential of a reference memory cell.

8. A power source circuit device used for a non-volatile semiconductor memory, according to claim 7, wherein the first boost circuit comprises:

a charge pump circuit for outputting a high voltage potential to an output terminal of a boost circuit;

a power-on reset circuit for outputting a power-on reset signal which goes to a low level from a power source potential when a predetermined time passes after turning on a power source;

an NMOS-I type transistor having a source connected to an output terminal of the boost circuit, and a drain and a gate connected to the power source potential VDD;

a first PMOS transistor having a source and a well connected to the power source potential VDD, and a gate supplied with the power-on reset signal;

a second PMOS transistor having a source and a well connected to the output terminal of the boost circuit, and a drain connected to a drain of the first PMOS transistor; and a level shifter circuit having an input terminal supplied with the power-on reset signal, a power source terminal connected to the output terminal of the boost circuit, and an output terminal connected to the second PMOS transistor.

9. A power source circuit device used for a non-volatile semiconductor memory, according to claim 7, wherein the first boost circuit comprises:

a charge pump circuit for outputting a high voltage potential to an output terminal of a boost circuit;

a power-on reset circuit for outputting a power-on reset signal which goes to a low level from a power source potential when a predetermined time passes after turning on a power source;

a first NMOS-I type transistor having a source connected to an output terminal of the boost circuit, and a drain and a gate connected to the power source potential VDD;

a first PMOS transistor having a source and a well connected to the power source potential VDD, and a gate supplied with the power-on reset signal;

a second PMOS transistor having a source and a well connected to the output terminal of the boost circuit, and a drain connected to a drain of the first PMOS transistor;

a first level shifter circuit having an input terminal supplied with an inverted signal of a read signal, and a power source terminal connected to the output terminal of the boost circuit, for outputting an inverted signal of an input signal;

a second NMOS-I type transistor having a gate connected to an output terminal of the first level shifter, a source connected to the power source potential VDD, and a drain connected to the output terminal of the boost circuit;

a delay circuit having an input terminal supplied with the inverted signal of the read signal;

a first NOR gate having a firs input terminal connected to an output terminal of the delay circuit, and a second input terminal supplied with the inverted signal of the read signal;

a second NOR gate having a first input terminal supplied with the power-on reset signal, and a second input terminal supplied with an inverted signal of an output signal of the first NOR gate; and a second level shifter having an input terminal connected with an output terminal of the second NOR gate, a power source terminal connected to the output terminal of the boost circuit, and an output terminal connected to a gate of the second PMOS transistor, for outputting an inverted signal of an input signal.

10. A power source circuit device according to claim 7, wherein said third stepdown circuit further has another input terminal supplied with an output potential of said first boost circuit and outputs a potential obtained by lowering the output potential of said first boost circuit, instead of the potential obtained by lowering the power source potential VDD.

11. A power source circuit device used for a non-volatile semiconductor memory, comprising:

a first reference potential generation circuit for outputting a first reference potential and for stopping operation in a stand-by state;

a second reference potential generation circuit of a low power consumption type, for outputting a second reference potential;

a first boost circuit having an input terminal supplied with the first reference potential, for outputting either a power source potential or a first high voltage potential generated;

a second boost circuit for generating and outputting a second high voltage potential used for a drain potential of a write transistor;

a first stepdown circuit having an input terminal supplied with the output potential of the first boost circuit and the first and second reference potentials, for outputting either a potential obtained by lowering the output potential of the first boost circuit or the output potential of the first boost circuit, to be used for a gate potential and a source potential of a memory cell; and a second stepdown circuit having an input terminal supplied with the output potential of the first boost circuit and the first reference potential, for outputting a potential obtained by lowering the output potential of the first boost circuit, to be used for a gate potential of the write transistor.

12. A power source circuit device used for a non-volatile semiconductor memory, according to claim 11, wherein the first boost circuit comprises:

a charge pump circuit for outputting a high voltage potential to an output terminal of a boost circuit;

a power-on reset circuit for outputting a power-on reset signal which goes to a low level from a power source potential when a predetermined time passes after turning on a power source;

an NMOS-I type transistor having a source connected to an output terminal of the boost circuit, and a drain and a gate connected to the power source potential VDD;

a first PMOS transistor having a source and a well connected to the power source potential VDD, and a gate supplied with the power-on reset signal;

a second PMOS transistor having a source and a well connected to the output terminal of the boost circuit, and a drain connected to a drain of the first PMOS transistor; and a level shifter circuit having an input terminal supplied with the power-on reset signal, a power source terminal connected to the output terminal of the boost circuit, and an output terminal connected to the second PMOS transistor.

13. A power source circuit device used for a non-volatile semiconductor memory, according to claim 11, wherein the first boost circuit comprises:

a charge pump circuit for outputting a high voltage potential to an output terminal of a boost circuit;

a power-on reset circuit for outputting a power-on reset signal which goes to a low level from a power source potential when a predetermined time passes after turning on a power source;

a first NMOS-I type transistor having a source connected to an output terminal of the boost circuit, and a drain and a gate connected to the power source potential VDD;

a first PMOS transistor having a source and a well connected to the power source potential VDD, and a gate supplied with the power-on reset signal;

a second PMOS transistor having a source and a well connected to the output terminal of the boost circuit, and a drain connected to a drain of the first PMOS transistor;

a first level shifter circuit having an input terminal supplied with an inverted signal of a read signal, and a power source terminal connected to the output terminal of the boost circuit, for outputting an inverted signal of an input signal;

a second NMOS-I type transistor having a gate connected to an output terminal of the first level shifter, a source connected to the power source potential VDD, and a drain connected to the output terminal of the boost circuit;

a delay circuit having an input terminal supplied with the inverted signal of the read signal;

a first NOR gate having a firs input terminal connected to an output terminal of the delay circuit, and a second input terminal supplied with the inverted signal of the read signal;

a second NOR gate having a first input terminal supplied with the power-on reset signal, and a second input terminal supplied with an inverted signal of an output signal of the first NOR gate; and a second level shifter having an input terminal connected with an output terminal of the second NOR gate, a power source terminal connected to the output terminal of the boost circuit, and an output terminal connected to a gate of the second PMOS transistor, for outputting an inverted signal of an input signal.

14. A power source circuit device used for a non-volatile semiconductor memory, comprising:

a first reference potential generation circuit for outputting a first reference potential and for stopping operation in a stand-by state;

a second reference potential generation circuit of a low power consumption type, for outputting a second reference potential;

a first boost circuit having an input terminal supplied with the first reference potential, for outputting either a power source potential or a first high voltage potential generated;

a second boost circuit for generating and outputting a second high voltage potential used for a drain potential of a write transistor;

a first stepdown circuit having an input terminal supplied with the output potential of the first boost circuit and the first reference potential of the first reference potential generation circuit, for outputting either a potential obtained by lowering the output potential of the first boost circuit or the output potential of the first boost circuit, to be used for a gate potential and a source potential of a memory cell;

a second stepdown circuit having an input terminal supplied with the output potential of the first boost circuit and the first reference potential, for outputting a potential obtained by lowering the output potential of the first boost circuit, to be used for a gate potential of the write transistor;

a second reference potential generation circuit of a low power consumption type, for outputting a second reference potential; and a third stepdown circuit having an input terminal supplied with the second reference potential of the second reference potential generation circuit, for outputting a potential obtained by lowering the power source potential, to be used for the gate potential of the memory cell when reading data from the memory cell.

15. A power source circuit device used for a non-volatile semiconductor memory, according to claim 14, wherein the first boost circuit comprises:

a charge pump circuit for outputting a high voltage potential to an output terminal of a boost circuit;

a power-on reset circuit for outputting a power-on reset signal which goes to a low level from a power source potential when a predetermined time passes after turning on a power source;

an NMOS-I type transistor having a source connected to an output terminal of the boost circuit, and a drain and a gate connected to the power source potential VDD;

a first PMOS transistor having a source and a well connected to the power source potential VDD, and a gate supplied with the power-on reset signal;

a second PMOS transistor having a source and a well connected to the output terminal of the boost circuit, and a drain connected to a drain of the first PMOS transistor; and a level shifter circuit having an input terminal supplied with the power-on reset signal, a power source terminal connected to the output terminal of the boost circuit, and an output terminal connected to the second PMOS transistor.

16. A power source circuit device used for a non-volatile semiconductor memory, according to claim 14, wherein the first boost circuit comprises:

a charge pump circuit for outputting a high voltage potential to an output terminal of a boost circuit;

a power-on reset circuit for outputting a power-on reset signal which goes to a low level from a power source potential when a predetermined time passes after turning on a power source;

a first NMOS-I type transistor having a source connected to an output terminal of the boost circuit, and a drain and a gate connected to the power source potential VDD;

a first PMOS transistor having a source and a well connected to the power source potential VDD, and a gate supplied with the power-on reset signal;

a second PMOS transistor having a source and a well connected to the output terminal of the boost circuit, and a drain connected to a drain of the first PMOS transistor;

a first level shifter circuit having an input terminal supplied with an inverted signal of a read signal, and a power source terminal connected to the output terminal of the boost circuit, for outputting an inverted signal of an input signal;

a second NMOS-I type transistor having a gate connected to an output terminal of the first level shifter, a source connected to the power source potential VDD, and a drain connected to the output terminal of the boost circuit;

a delay circuit having an input terminal supplied with the inverted signal of the read signal;

a first NOR gate having a first input terminal connected to an output terminal of the delay circuit, and a second input terminal supplied with the inverted signal of the read signal;

a second NOR gate having a first input terminal supplied with the power-on reset signal, and a second input terminal supplied with an inverted signal of an output signal of the first NOR gate; and a second level shifter having an input terminal connected with an output terminal of the second NOR gate, a power source terminal connected to the output terminal of the boost circuit, and an output terminal connected to a gate of the second PMOS transistor, for outputting an inverted signal of an input signal.

17. A power source circuit device used for a non-volatile semiconductor memory, according to claim 1, wherein the reference potential generation circuit includes:

a first PMOS transistor having a source connected to the power source potential;

a second PMOS transistor having a source connected to a drain of the first PMOS transistor;

an NMOS transistor having a gate and a drain connected to a drain of the second PMOS transistor;

a third PMOS transistor having a source connected to the drain of the first PMOS transistor, and a gate and a drain connected to a gate of the second PMOS transistor;

an NMOS-I type transistor having a gate connected to the gate of the NMOS transistor, and a drain connected to the drain of the third PMOS transistor;

a first resistor having an end connected to a source of the NMOS-I type transistor, and another end grounded;

a calculation amplifier having an inverted input terminal connected to the gate of the NMOS-I type transistor, a non-inverted input terminal is connected to the drain of the NMOS-I type transistor, and an output terminal connected to a gate of the first PMOS transistor;

a fourth PMOS transistor having a source connected to the drain of the first PMOS transistor, a gate connected to the drain of the NMOS-I type transistor, and a drain potential equal to the reference potential; and a second resistor to having an end connected to a drain of the fourth PMOS transistor, another end grounded, and an resistance value which can be finely adjusted.

18. A power source circuit device used for a non-volatile semiconductor memory, according to claim 1, wherein the reference potential generation circuit includes first and second reference potential generation circuits, wherein the first reference potential generation circuit comprises:

a first PMOS transistor;

a second PMOS transistor having a source connected to a drain of the first PMOS transistor;

a first NMOS transistor having a gate and a drain connected to a drain of the second PMOS transistor;

a third PMOS transistor having a source connected to the drain of the first PMOS transistor, and a gate and a drain connected to a gate of the second PMOS transistor;

a first NMOS-I type transistor having a gate connected to the gate of the NMOS transistor, and a drain connected to the drain of the third PMOS transistor;

a first resistor having an end connected to a source of the first NMOS-I type transistor, and another end grounded;

a first calculation amplifier having an inverted input terminal connected to the gate of the NMOS-I type transistor, a non-inverted input terminal connected to the drain of the NMOS-I type transistor, and an output terminal connected to a gate of the first PMOS transistor;

a fourth PMOS transistor having a source connected to the drain of the first PMOS transistor, a gate connected to the drain of the first NMOS-I type transistor, and a drain potential equal to the first reference potential;

a second resistor having an end connected to a drain of the fourth PMOS transistor, another end grounded, and an resistance value which can be finely adjusted;

a fifth PMOS transistor having a drain connected to a source of the first PMOS transistor, a source connected to the power source potential, and a gate supplied with a control signal; and a second NMOS transistor having a drain connected to the drain of the fourth PMOS transistor, a source grounded, and a gate supplied with the control signal, and wherein the second reference potential generation circuit comprises:

- a sixth PMOS transistor having a source connected to the power source potential;
- a seventh PMOS transistor having a source connected to a drain of the sixth PMOS transistor;
- a third NMOS transistor having a gate and a drain connected to a drain of the seventh PMOS transistor;
- an eighth PMOS transistor having a source connected to the drain of the sixth PMOS transistor, and a gate and a drain connected to a gate of the seventh PMOS transistor;
- a second NMOS-I type transistor having a gate connected to the gate of the third NMOS transistor, and a drain connected to the drain of the eighth PMOS transistor;
- a third resistor having an end connected to a source of the NMOS-I type transistor, and another end grounded;
- a second calculation amplifier having an inverted input terminal connected to the gate of the second NMOS-I type transistor, a non-inverted input terminal connected to the drain of the second NMOS-I type transistor, and an output terminal connected to a gate of the sixth PMOS transistor;
- a ninth PMOS transistor having a source connected to the drain of the sixth PMOS transistor, a gate connected to the drain of the second NMOS-I type transistor, and a drain potential equal to the second reference potential; and
- a fourth resistor to having an end connected to a drain of the ninth PMOS transistor, another end grounded, and a resistance value which can be finely adjusted.

* * * * *